United States Patent
Matsuu et al.

(10) Patent No.: US 9,451,672 B2
(45) Date of Patent: Sep. 20, 2016

(54) LIGHT SOURCE AND OPTICAL COHERENCE TOMOGRAPHY APPARATUS USING THE SAME

(71) Applicant: CANON KABUSHIKI KAISHA, Tokyo (JP)

(72) Inventors: Toshimitsu Matsuu, Yokohama (JP); Tatsuro Uchida, Machida (JP); Takeshi Yoshioka, Kawasaki (JP); Takeshi Uchida, Tokyo (JP); Yoshinobu Sekiguchi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 14/035,747

(22) Filed: Sep. 24, 2013

(65) Prior Publication Data

US 2014/0092391 A1    Apr. 3, 2014

(30) Foreign Application Priority Data

Sep. 28, 2012 (JP) ................................ 2012-217189

(51) Int. Cl.
*G01B 9/02* (2006.01)
*H05B 37/02* (2006.01)
*H01L 33/00* (2010.01)
*H01L 27/15* (2006.01)

(52) U.S. Cl.
CPC ........... *H05B 37/02* (2013.01); *G01B 9/02007* (2013.01); *G01B 9/02091* (2013.01); *H01L 27/153* (2013.01); *H01L 33/0045* (2013.01)

(58) Field of Classification Search
CPC .............. H05B 37/02; H05B 33/0803; G01B 9/02091; G01B 9/02007; G01B 9/02044; G01B 2290/45; G01B 11/2441; H01L 27/153; H01L 33/0045; H01L 33/06; G01N 2021/1787; H01S 5/22

USPC .............. 356/479, 450, 477, 451, 497, 432; 257/98, 14

See application file for complete search history.

(56) References Cited

U.S. PATENT DOCUMENTS

| 4,577,207 | A | * | 3/1986 | Copeland | ................ | H01L 27/15 257/103 |
| 5,033,053 | A | * | 7/1991 | Shimizu | ................ | B82Y 20/00 372/23 |
| 5,126,803 | A | * | 6/1992 | Hager et al. | .................... | 257/94 |

(Continued)

OTHER PUBLICATIONS https://en.wikipedia.org/wiki/Ballistic_photon.*

(Continued)

*Primary Examiner* — Tarifur Chowdhury
*Assistant Examiner* — Mohamed K Amara
(74) *Attorney, Agent, or Firm* — Canon U.S.A. Inc., IP Division

(57) ABSTRACT

A light source includes a control unit that controls currents injected into at least one light emitting region and a light emission spectrum conversion region. The at least one light emitting region includes a first light emitting region and a second light emitting region different from the first light emitting region, light that is emitted from the first light emitting region and passes through the light emission spectrum conversion region is combined with the light that is emitted from the first or second light emitting region and does not pass through the light emission spectrum conversion region. The control unit controls the currents injected into the light emission spectrum conversion region and the first light emitting region so that the current density of the light emission spectrum conversion region is smaller than the current density of the first light emitting region.

14 Claims, 19 Drawing Sheets

(56) References Cited

U.S. PATENT DOCUMENTS

| | | | | |
|---|---|---|---|---|
| 5,252,839 | A * | 10/1993 | Fouquet | B82Y 20/00 257/13 |
| 5,321,501 | A * | 6/1994 | Swanson et al. | 356/479 |
| 2010/0259758 | A1 * | 10/2010 | Asano | 356/479 |
| 2011/0292399 | A1 * | 12/2011 | Alphonse | 356/479 |
| 2012/0307857 | A1 * | 12/2012 | Oh | H01S 5/026 372/46.01 |
| 2015/0263219 | A1 * | 9/2015 | Yamagata | G01B 9/02044 356/479 |

OTHER PUBLICATIONS

P.I. Lapin, et al., "Novel Near-IR Broad-Band Light Sources for Optical Coherence Tomography Based on Superluminescent Diodes", Optical Coherence Tomography and Coherence Techniques II, edited by Wolfgang Drexler, SPIE-OSA Biomedical Optics, SPIE 2005, vol. 5861.

David Beitel, et al, "Development of Broadband Sources Based on Semiconductor Optical Amplifiers and Erbium-Doped Fiber Amplifiers for Optical Coherence Tomography", IEEE Journal of Selected Topics in Quantum Electronics, Jan./Feb. 2008, pp. 243-250, vol. 14, No. 1.

Z.Y. Zhang, et al., "Self-Assembled Quantum-Dot Superluminescent Light-Emitting Diodes", Advances in Optics and Photonics 2, 2010, pp. 201-228.

Xinkun Li, et al., "A High-Performance Quantum Dot Superluminescent Diode with a Two-Section Structure", Nanoscale Research Letters, 2011, 6:625.

Lin et al., "Broad-Band Superluminescent Diodes Fabricated on a Substrate with Asymmetric Dual Quantum Wells", IEEE Photonics Technology Letters, Nov. 1996, pp. 1456-1458, vol. 8, No. 11.

* cited by examiner

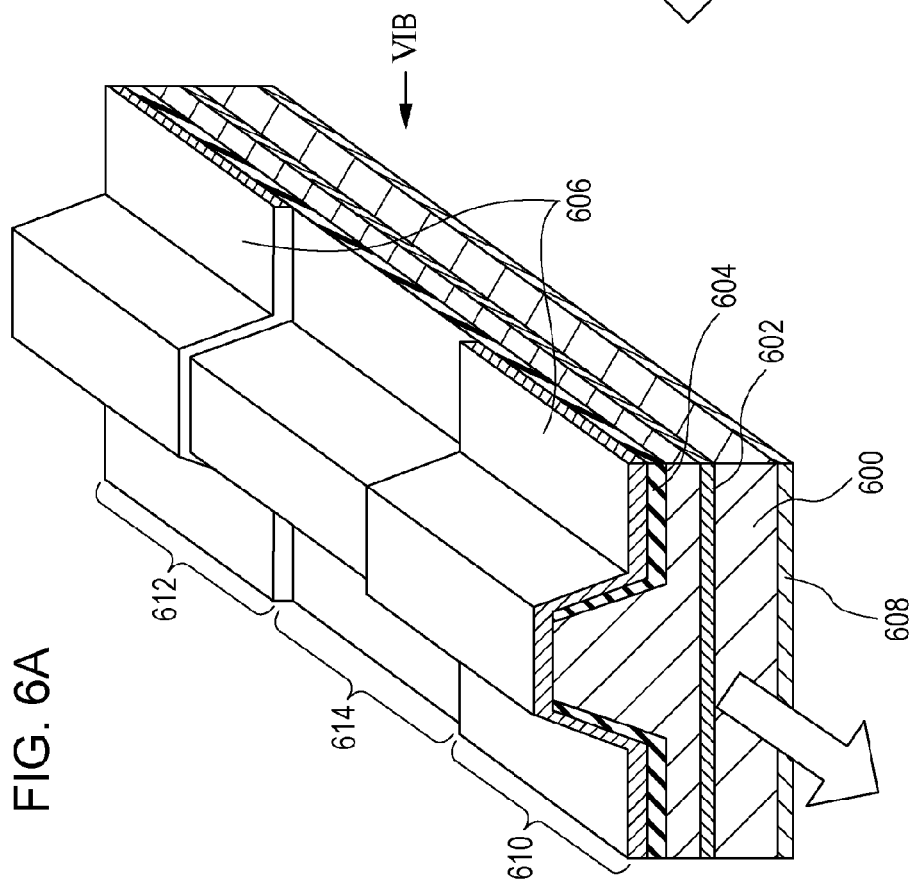
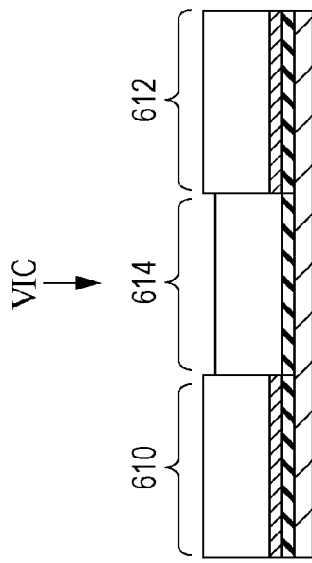
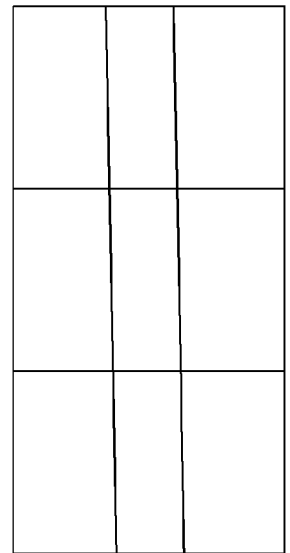

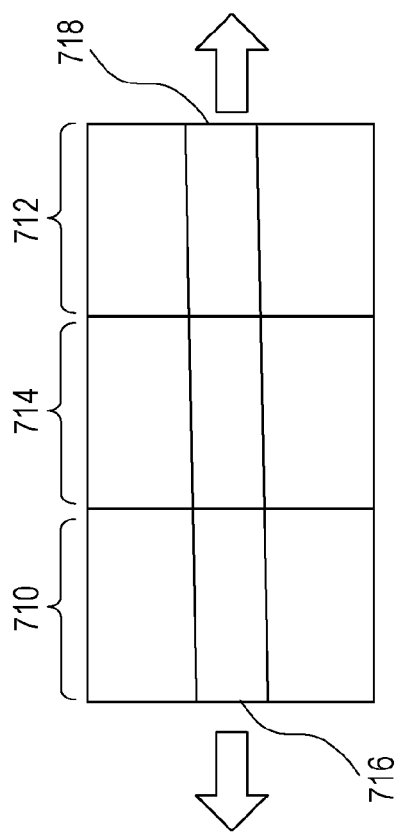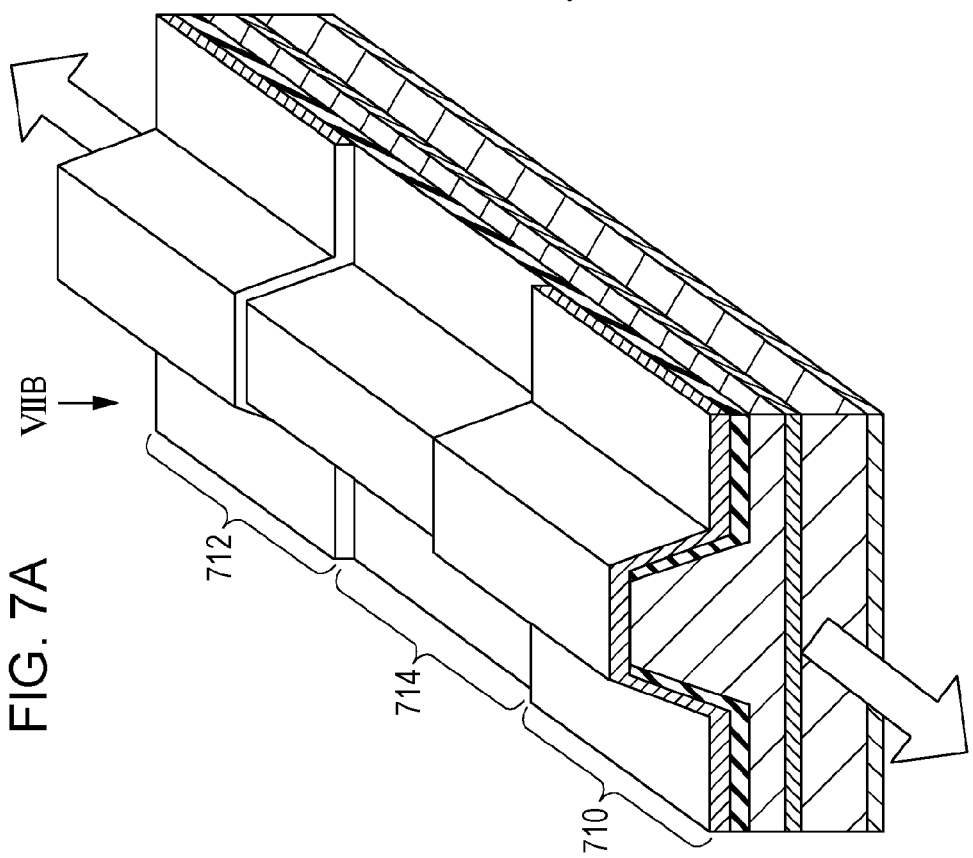

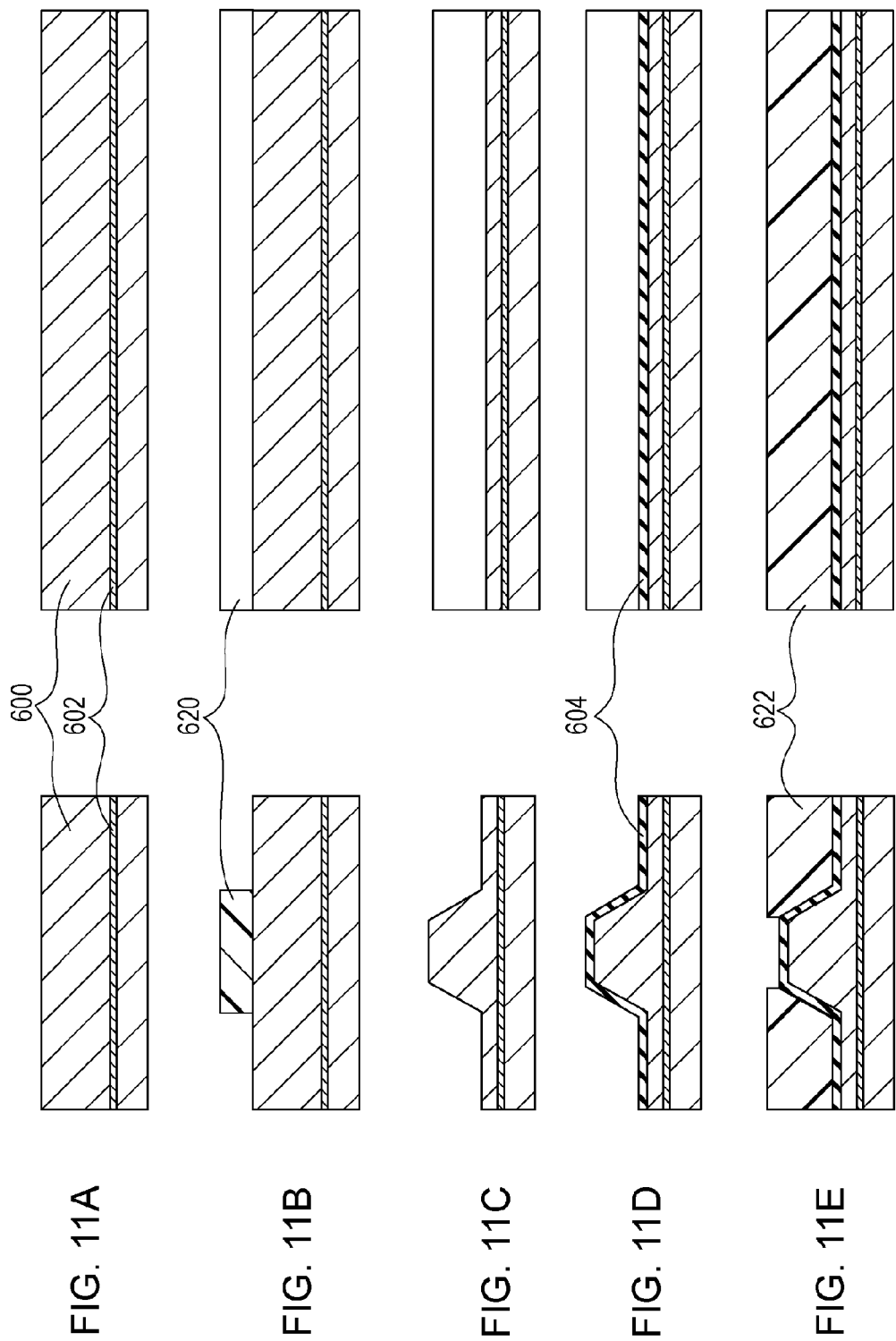

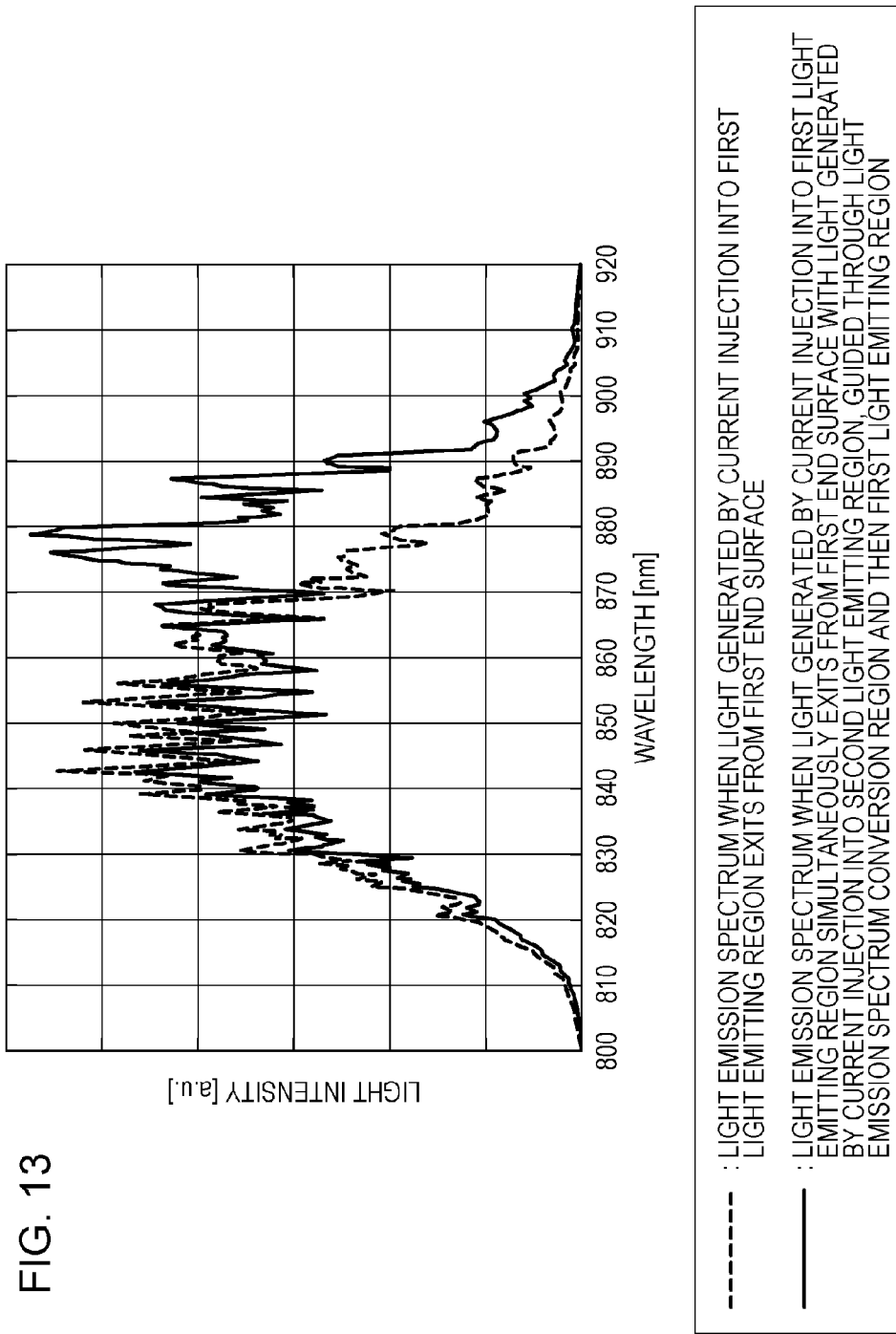

LIGHT SOURCE AND OPTICAL COHERENCE TOMOGRAPHY APPARATUS USING THE SAME

BACKGROUND OF THE INVENTION

1. Field of the Invention

The present invention relates to a light source and an optical coherence tomography apparatus using the light source.

2. Description of the Related Art

Superluminescent diodes (may alternatively be abbreviated as SLD hereafter) are a semiconductor light source that emits light having a wide range of a spectral distribution similarly to light emitting diodes while permitting a comparatively high optical power of equal to or more than 1 mW to be obtained similarly to semiconductor lasers. Due to their characteristics, SLDs receive attention in the medical and measuring fields where high-resolution is required, and are used as the light source of, for example, optical coherence tomography (OCT) apparatus, with which tomographic images of body tissue can be obtained.

In order to obtain a high-resolution tomographic image, a light source that emits light having a light emission spectrum of a wide full with at half maximum can be used. Examples of structures used in such a light source include: an asymmetric dual quantum well structure having different quantum well widths described in IEEE Photonics Technology Letters, vol. 8, no. 11, pp. 1456-1458, 1996; a plurality of quantum well structures with varied compositions; and an active layer having a single quantum well structure. With these structures, it is intended that light emission spectra from different energy levels are superposed with one another so as to obtain a wide full width at half maximum.

SUMMARY OF THE INVENTION

With the technology described in the above-described document, a wide spectral range can be obtained by increasing the current injection amount. However, the half width of the spectrum is limited due to a gain spectrum of each quantum well or a device structure. Thus, the SLD described in the above-described document cannot emit light having a light emission spectrum of a sufficiently wide full width at half maximum.

In view of the above-described problem, the present invention provides a light source that emits light having a light emission spectrum of a wider full width at half maximum.

A light source according to an aspect of the present invention includes a superluminescent diode, which includes at least one light emitting region and a light emission spectrum conversion region, and a control unit that controls currents injected into the at least one light emitting region and the light emission spectrum conversion region. In the light source, the at least one light emitting region includes a first light emitting region and a second light emitting region different from the first light emitting region, light that is emitted from the first light emitting region and passes through the light emission spectrum conversion region is combined with the light that is emitted from the first light emitting region or the second light emitting region and does not pass through the light emission spectrum conversion region. In the light source, the control unit controls the currents injected into the light emission spectrum conversion region and the first light emitting region so that the current density of the light emission spectrum conversion region is smaller than the current density of the first light emitting region.

Further features of the present invention will become apparent from the following description of exemplary embodiments with reference to the attached drawings.

BRIEF DESCRIPTION OF THE DRAWINGS

FIGS. 6A, 6B, and 6C are respectively a perspective view, a plan view seen from a VIB direction in FIG. 6A, and a plan view seen from a VIC direction in FIG. 6B illustrating a light source according to a third embodiment of the present invention.

FIGS. 7A and 7B are respectively a perspective view and a plan view illustrating a light source according to a fourth embodiment of the present invention.

FIGS. 11A to 11E are diagrams illustrating a procedure of producing a light source in a second example of the present invention.

FIG. 13 is a graph illustrating light emission spectra obtained from a light source produced in accordance with the second example of the present invention.

DESCRIPTION OF THE EMBODIMENTS

Figure 1:
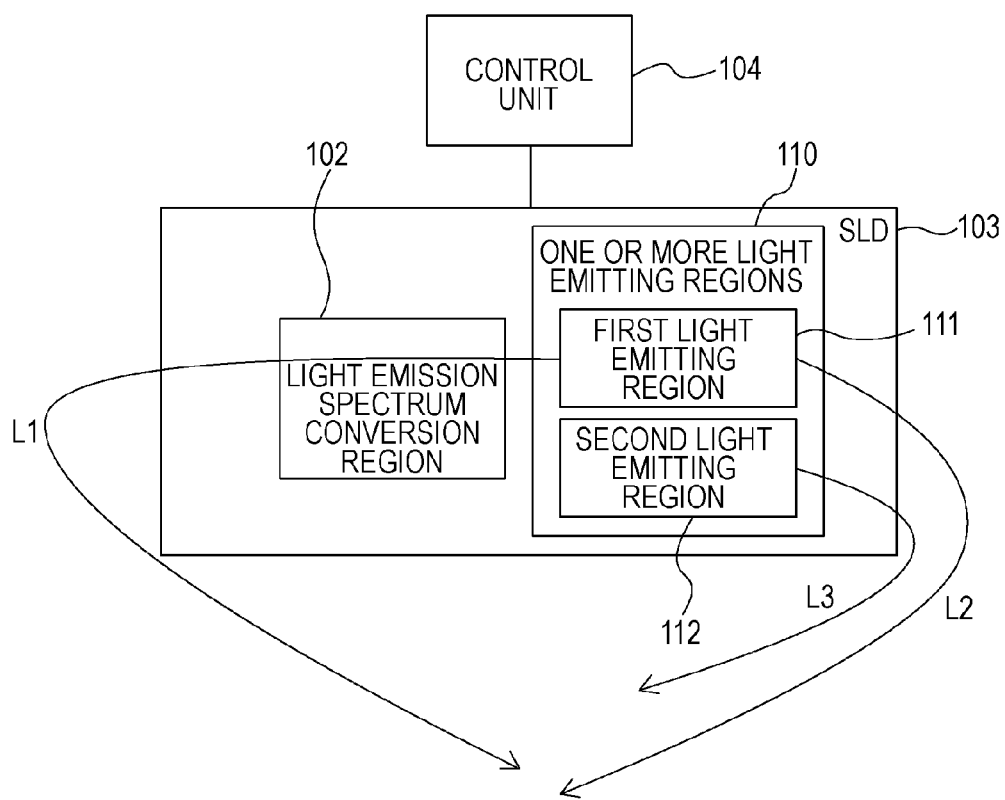
FIG. 1 is a diagram illustrating a light source according to an embodiment of the present invention.

A light source according to an embodiment of the present invention will be described below with reference to FIG. 1. The description here is common to embodiments which will be described later.

A light source of each embodiment according to the present invention includes a superluminescent diode (SLD) 103 and a control unit 104. The SLD 103 includes one or more light emitting regions 110 (FIG. 1 illustrated a case where two light emitting regions are provided) and a light emission spectrum conversion region 102. The control unit 104 controls current to be injected into the one or more light emitting regions 110 and the light emission spectrum conversion region 102. The SLD 103 combines light L1 with light L2 or L3. The light L1 is emitted from a first light emitting region 111, which is one of the one or more light emitting regions 110 and passes through the light emission spectrum conversion region 102. The light L2 is emitted from the first light emitting region 111 and does not pass through the light emission spectrum conversion region 102. The light L3 is emitted from a second light emitting region 112, which is another one of the one or more light emitting regions 110 different from the first light emitting region 111, and does not pass through the light emission spectrum conversion region 102. The control unit 104 controls current to be injected into the light emission spectrum conversion region 102 and the one or more light emitting regions 110.

When light emitted from the first light emitting region 111 passes through the light emission spectrum conversion region 102, out of the light emission spectrum thereof, a short wavelength component is absorbed and a long wavelength component is not absorbed. The light having passed through the light emission spectrum conversion region 102 has the long wavelength component, the intensity of which is similar to or more than that of the light emitted from the first light emitting region 111. Furthermore, the light having passed through the light emission spectrum conversion region 102 has a component of a longer wavelength range not included in the light emission spectrum of the light before passing through the light emission spectrum conversion region 102, or exhibits an increased light intensity in the long wavelength range, the light intensity of which is weak before passing through the light emission spectrum conversion region 102. Thus, the light emitted from the light source according to the present embodiment has the light emission spectrum of a wider full width at half maximum. Furthermore, as will be described later in third to fifth embodiments, in the case where the light passed through the light emission spectrum conversion region 102 is further incident upon a different light emitting region, even when the intensity of the light is weak at the time the light is emitted from the light emission spectrum conversion region, the light is amplified by the different light emitting region. For example, by causing the light emitted from the first light emitting region 111 to pass through the light emission spectrum conversion region 102 and further pass through the second light emitting region 112, light having an amplified long wavelength range can be emitted.

The short wavelength component remains in the light emission spectrum of the light emitted from the first light emitting region 111 and does not pass through the light emission spectrum conversion region 102. Likewise, the short wavelength component remains in the light emission spectrum of the light emitted from the second light emitting region 112 and does not pass through the light emission spectrum conversion region 102. Thus, by combining the light L1 with the light L2 or the light L3, a light source that emits light having a light emission spectrum of a wider full width at half maximum than that of the light emitted from the first light emitting region 111 can be achieved.

The SLD herein is a light emitting element that has properties intermediate between the properties of a laser and a light emitting diode (LED). Specifically, when the current injected into each of the SLDs is being increased, unlike LEDs, the light intensity does not linearly change, or unlike the laser, the gradient of the linear change does not change when the threshold current is reached. The light intensity of an SLD typically exhibits a change proportional to the square of the current injection amount. The half width of the light emission spectrum of the SLD is, for example, equal to or more than 10 nm, which is larger than that of the laser and smaller than that of the LED.

Light Emitting Region

In each embodiment of the present invention, the light emitting region refers to a region including an active layer that emits light having a wavelength width.

Light Emission Spectrum Conversion Region

In each embodiment of the present invention, the light emission spectrum conversion region refers to a region in which the wavelength and intensity of light guided therethrough are changed. Specifically, the light emission spectrum conversion region is a region of an active layer of an SLD, the region being a region into which current are injected or not injected so that the current density thereof is less than that of the light emitting region.

The amount by which the wavelength and intensity of light are converted differs in accordance with the density of the current injected into the light emission spectrum conversion region.

The light emission spectrum conversion region can be the same active layer as the above-described light emitting region.

Typical SLDs may have a region adjacent to the light emitting region and into which the current is not injected. In this case, this region is used to absorb the light so as to suppress reflection of the light for suppressing laser oscillation. In each of the present embodiments, by intentionally utilizing light guided through the light emission spectrum conversion region as output light, a wide full width at half maximum of the spectrum can be obtained.

A light source according to each embodiment of the present invention will be described in detail below with a specific example.

Active Layer

A quantum well structure desirable to the active layer differs in accordance with the wavelength of light to be emitted. The light emission wavelength of the quantum well structure is determined in accordance with the materials of a well layer and a barrier layer and the thickness of the well layer. In the following description, as an example of a quantum well desirable to the light emission wavelength of the active layer, the light emission wavelength of a ground level of the quantum well is mainly described.

For example, in order to make the ground level emit light in a range from 800 to 850 nm, the well layer is formed of an $Al_xGa_{(1-x)}As$, the Al composition x of which is preferably 0 to 0.15. The barrier layer can be formed of an AlGaAs, the Al composition of which can be more than that of the well layer. In this case, the thickness of the quantum well layer is preferably 5 to 10 nm. However, since the light emission wavelength of the ground level is determined in accordance with the thickness and material of the well layer, light emission in the above-described wavelength range can be realized with a thickness reduced to less than 5 nm, using a material having a band gap corresponding to a wavelength reduced in accordance with the reduction in the thickness.

In order to make the ground level emit light in a wavelength range from 850 to 900 nm, an $In_xGa_{(1-x)}As$, the In composition of which is 0 to 0.1, can be used. The barrier layer can be formed of GaAs or AlGaAs. The thickness of the well layer is preferably 5 to 10 nm. However, since the light emission wavelength of the ground level is determined in accordance with the thickness and material of the well layer, light emission in the above-described wavelength range can be realized with a thickness reduced to less than 5 nm, using a material having a band gap corresponding to a wavelength reduced in accordance with the reduction in the thickness.

For light emission at the same range from 800 to 900 nm, the material is not limited to the above-described material. Another material may be used as long as the material emits light at this wavelength range. For example, the quantum well structure may be realized by using GaInAsP for the well layer in accordance with the above-described design.

Likewise, for other wavelength ranges, the active layer can be realized by using a well layer that emits light in a wavelength range and a barrier layer formed of a material having a wider band gap than that of the well layer and by adjusting the width of the well layer. For example, for light emission in a 980 nm range, an InGaAs, the In composition of which is about 0.2, can be used for the well layer, and for light emission at 1550 nm, an InGaAs, the In composition of which is about 0.68 so as to achieve lattice matching with an InP substrate, can be used.

A single or a plurality of the above-described quantum well structures can be used as the active layer of an SLD. When a plurality of quantum well structures is used, light emission in a wider wavelength range can be achieved by using a plurality of quantum well structures, light emission wavelengths of which are different from one another.

In the above description, the active layer uses the quantum well structure. The quantum well structure can be used for the SLD because of, for example, its gain characteristics and ease of manufacture. However, the structure of the active layer used for the SLD is not limited to the quantum well structure. For example, the active layer may use a so-called bulk structure having a width that allows the quantum effect to be reduced, a quantum wire, or a quantum dot structure.

The control unit 104 of the light source according to each of the present embodiments preferably control the current injected into the light emission spectrum conversion region 102 and the first light emitting region 111 so that the current density of the light emission spectrum conversion region 102 is equal to or less than 10% of that of the first light emitting region 111.

The control unit 104 of the light source according to each of the present embodiments preferably controls the current injected into the light emission spectrum conversion region 102 so that the current density of the light emission spectrum conversion region 102 is in a range from 0 to 2 $kA/cm^2$.

The control unit 104 of the light source according to each of the present embodiments more preferably controls the current injected into the light emission spectrum conversion region 102 so that the current density of the light emission spectrum conversion region 102 is 0 $kA/cm^2$.

First Embodiment

Two SLDs

Figure 2A:
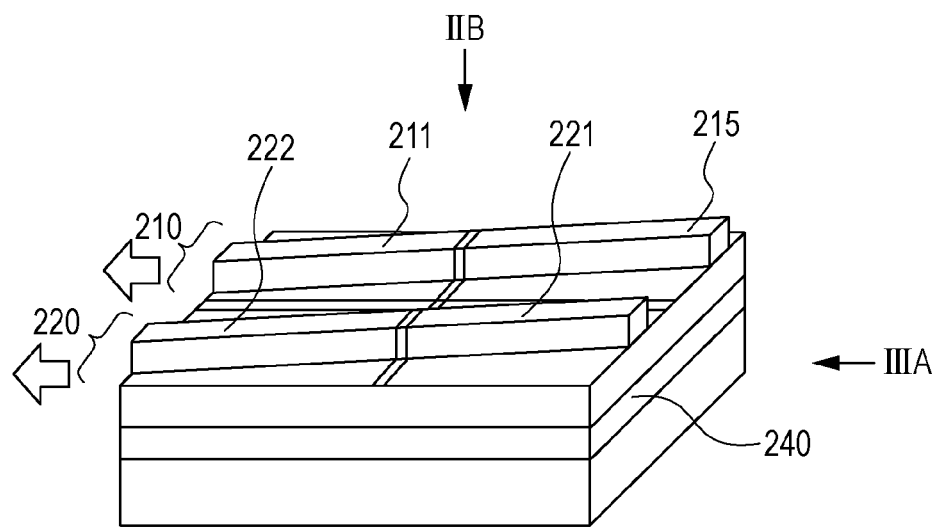
FIGS. 2A and 2B are respectively a perspective view and a plan view illustrating a light source according to a first embodiment of the present invention.
Figure 2B:
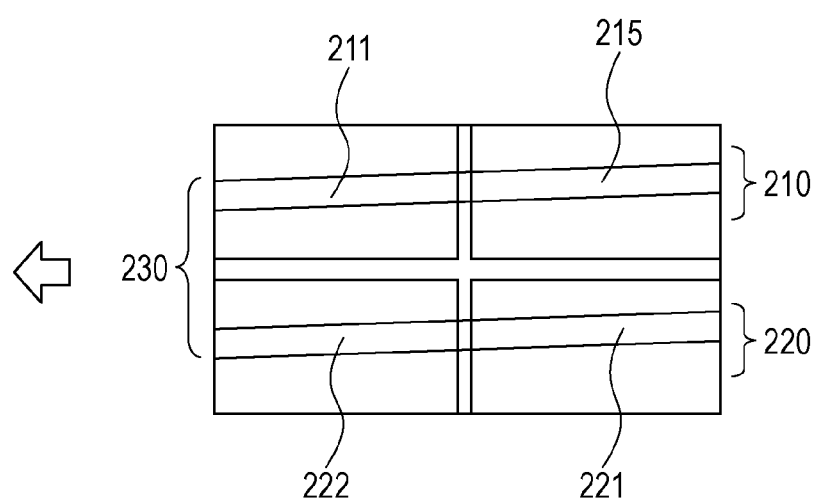

A light source according to a first embodiment is described below with reference to FIGS. 2A and 2B. FIG. 2A is a perspective view schematically illustrating the light source according to the present embodiment, and FIG. 2B is a plan view of the light source seen from a direction indicated by an arrow IIB in FIG. 2A.

The light source according to the present embodiment includes two SLDs, that is, a first SLD 210 and a second SLD 220, formed on the same substrate.

The first SLD 210 includes a first light emitting region 211 and an absorption region 215. The second SLD 220 includes a light emission spectrum conversion region 222 and a second light emitting region 221.

In the first SLD 210, the current is injected into the first light emitting region 211 and output light is extracted from an exit end surface of the first light emitting region 211. In the second SLD 220, the current is injected into the second light emitting region 221, light is guided through the light emission spectrum conversion region 222, and the output light is extracted from an exit end surface of the light emission spectrum conversion region 222.

The light extracted from each SLD is combined by an optical fiber 230.

The first light emitting region 211, the second light emitting region 221, the light emission spectrum conversion region 222, and the absorption region 215 have a common active layer 240.

The first SLD 210 and the second SLD 220 have ridge waveguide structures. The first light emitting region 211 and the absorption region 215 are formed of coaxial waveguides, and the light emission spectrum conversion region 222 and the second light emitting region 221 are formed of coaxial waveguides.

Figure 3A:
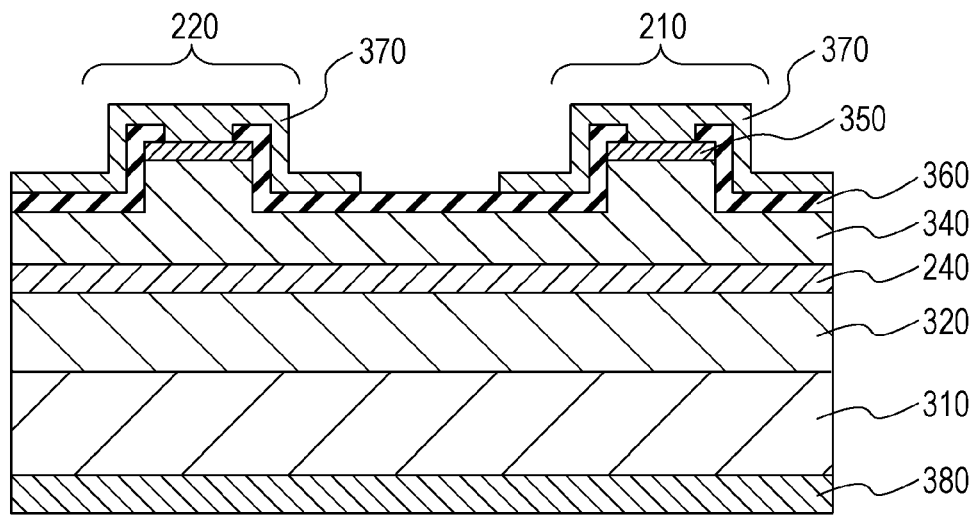
FIGS. 3A and 3B are diagrams illustrating a layered structure of the light source according to the first embodiment of the present invention.
Figure 3B:
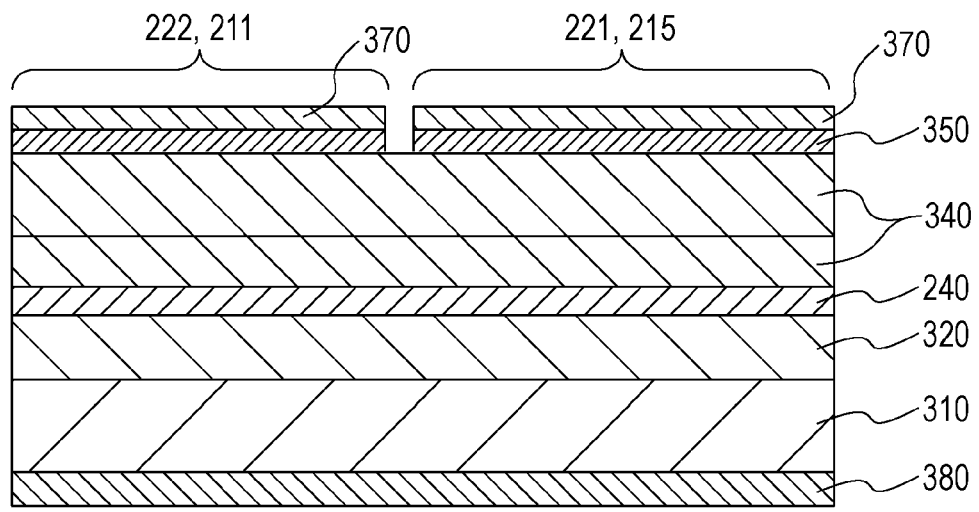

FIG. 3A is a sectional view of the light source according to the present embodiment seen from a direction indicated by an arrow IIIA in FIG. 2A, illustrating a layered structure of the light source. FIG. 3B is a sectional view with part of the structure illustrated in FIG. 3A such as an insulating film 360 omitted. Multilayer dielectric films may be added to end surfaces of the first SLD 210 and the second SLD 220 in order to control the reflectivity. Referring to FIGS. 3A and 3B, reference numerals denote components as follows: 380 denotes a lower electrode, 310 denotes a substrate, 320 denotes a lower clad layer, 240 denotes an active layer, 340 denotes an upper clad layer, 350 denotes a contact layer, 360 denotes an insulating layer, and 370 denotes upper electrodes.

Although a method of producing the light source will be specifically described in a first example, the dimensions of elements of the light source, steps in production, and various parameters are not limited to those of the first example.

In the present embodiment, the SLD includes the light emitting region, into which the current is injected, and the light emission spectrum conversion region. With this structure, light generated in the light emitting region is guided through the light emission spectrum conversion region, thereby permitting wide range spectrum characteristics to be obtained.

Here, in the case where the length of the light emission spectrum conversion region is excessively short, even when the light generated in the light emitting region is guided through the light emission spectrum conversion region, the effect of the present invention is not achieved as follows:

that is, the spectrum shape is almost unchanged or the intensity is only slightly reduced. In the case where the length of the light emission spectrum conversion region is excessively long, the light generated in the light emitting region is almost entirely absorbed. Thus, even when the light is combined, the effect is small and does not contribute to an increase in the spectral range.

The length of the light emission spectrum conversion region can be longer than a length at which much of the light is absorbed on the short wavelength side, in particular, much of the light is absorbed on the shorter wavelength side than a wavelength corresponding to the peak intensity of the light that directly exits the light emitting region is absorbed.

The light that exits from the exit end surface of the light emission spectrum conversion region desirably has a peak intensity equal to or more than a one fourth of that of the light that directly exits the light emitting region. The light that exits from the exit end surface of the light emission spectrum conversion region more desirably has a peak intensity equal to or more than a half of that of the light that directly exits the light emitting region so as to sufficiently increase the full width at half maximum.

The wavelength corresponding to the peak intensity of the light that exits from the exit end surface of the light emission spectrum conversion region is desirably on the longer wavelength side than that of the light that directly exits the light emitting region. The wavelength corresponding to the peak intensity of the light that exits from the exit end surface of the light emission spectrum conversion region is more desirably longer than the wavelength corresponding to the half the peak intensity on the long wavelength side of the light that directly exits the light emitting region.

Here, a preferable range of a length L of the light emission spectrum conversion region is described below.

It is defined that $P1(\lambda)$ is the intensity of the light that exits from the exit end surface of the light emitting region when a certain current is injected into the light emitting region; $P2(\lambda)$ is the intensity of light generated when the certain current is injected into the light emitting region, the generated light being the source of the light to be guided through the light emission spectrum conversion region and exiting from the exit end surface of the light emission spectrum conversion region; $P3(\lambda)$ is the intensity of the light that is guided through the light emission spectrum conversion region and exits from the exit end surface of the light emission spectrum conversion region; $\lambda 1$ is the wavelength corresponding to the peak intensity of P1; $\lambda 3$ is the wavelength corresponding to the peak intensity of P3, and $\alpha(\lambda)$ is absorption coefficient at each wavelength. Combined light utilized in the present invention is $P1(\lambda)+P3(\lambda)$, where $P3(\lambda)=P2(\lambda)\cdot\exp(-\alpha(\lambda)\cdot L)$.

In order to absorb the light on the short wavelength side to some degree, the length L is preferably longer than a length at which $P3(\lambda 1)$ and $P3(\lambda 2)$, which are the intensities of $P3(\lambda 2)$ corresponding to $\lambda 1$ and $\lambda 2$, are the same as one another as expressed as follows:

$$P2(\lambda 1)\cdot\exp(-\alpha(\lambda 1)\cdot L)=P2(\lambda 2)\cdot\exp(-\alpha(\lambda 2)\cdot L).$$

That is, the length L of the light emission spectrum conversion region is preferably longer than $L=\ln\{P2(\lambda 1)/P2(\lambda 2)\}/\{\alpha\lambda 1)-\alpha(\lambda 2)\}$.

In order to produce the effect to some degree when the light is combined, the length L is preferably satisfies the following expressions in which the peak intensity of P3 is equal to or more than a one fourth of the peak intensity of P1:

$$\tfrac{1}{4}\cdot P1(\lambda 1)<P2(\lambda 2)\cdot\exp(-\alpha(\lambda 2)\cdot L),$$

that is, $L<\ln\{4\cdot P2(\lambda 2)/P1(\lambda 1)\}/\alpha(\lambda 2)$.

Furthermore, the current caused to flow through the light emitting region in order to obtain $P1(\lambda)$ can be a current of a high current density with which light is emitted on the short wavelength side of the spectrum. The current caused to flow through the light emitting region in order to obtain $P2(\lambda)$ can be a current of a high current density with which a peak intensity equal to that of P1 can be obtained.

Unlike the light emission spectrum conversion region 222, the absorption region 215 is disposed on a side opposite to the exit end surface of the first light emitting region 211, that is, on a side opposite to the end surface where the output light of the first SLD 210 is extracted. The absorption region 215 is provided so as to suppress reflection. Although the absorption region 215 is not necessarily provided in light of the gist of the present invention, the absorption region 215 is provided in the present embodiment because the absorption region 215 is easily formed in the element production and contributes to suppression of reflection. For the same purpose, a light emission spectrum conversion region may also be provided for the second light emitting region 221 of the second SLD 220 in a portion adjacent to the second light emitting region 221 on a side opposite to the light emission spectrum conversion region 222.

In the present embodiment, the output light that exits from the exit end surface of the first light emitting region 211 of the first SLD 210 and the output light that exits from the exit end surface of the light emission spectrum conversion region 222 of the second SLD 220 are utilized. However, the output light that exits from the end surface of the absorption region 215 of the first SLD 210 and output light that exits from the end surface of the second light emitting region 221 of the second SLD 220 may be utilized so as to be combined to make the SLD have higher power and emit light in a wider wavelength range, or so as to be used as monitor light for each SLD. In this case, the absorption region 215 may be used to contribute to an increase in the spectral range as is the case with the light emission spectrum conversion region 222 instead of suppressing reflection.

The length and the current injection amount of the light emitting region and the light emission spectrum conversion region of each SLD may also be appropriately changed. A desired spectral shape can be obtained by combining these values in accordance with appropriate conditions. In addition to injecting or not injecting the current into the light emission spectrum conversion region, a reverse bias may be applied to the light emission spectrum conversion region.

The above-described formation methods, the semiconductor materials, the electrode materials, the dielectric materials, and the like are not limited to those disclosed in the embodiments. Other methods and materials can be used without departing from the gist of the present invention.

For example, the substrate may use a p-type GaAs substrate. In this case, the conductivity types of the semiconductor layers are changed in accordance with the changed substrate material.

Although the active layer uses an asymmetric multi-quantum well having different well widths, the active layer is not limited to this. Instead of using a quantum well having a different well widths, an asymmetric multi-quantum well having different compositions, or having different well widths and different compositions may be used. The number of quantum wells is not limited to four and may be two or three. Alternatively, a single quantum well may be used.

The material is not limited to the above description. GaAs, GaInP, AlGaInN, AlGaInAsP, AlGaAsSb, or another light emitting material may be used.

Although the ridge width is set to 4 μm in a first example below, the ridge width is not limited to this and may be appropriately changed.

Although the SLDs use ridges and each of the ridges is inclined, it is sufficient that the structure function as an SLD. For example, reflection may be suppressed by using a window structure instead of using an inclined ridge.

Unlike the present embodiment, in the case where voltage is not applied, an insulating film on the upper side of each ridge may be left so as to inhibit the current injection.

Although the light is combined by using the optical fiber as a light combiner here, a different light combining method may be used as long as output from each SLD can be combined together.

Although each light emitting region includes a single electrode, the light emitting region may include a plurality of electrodes, and the current is injected into each of the electrodes for driving. The light emission spectrum conversion region may include a plurality of electrodes so as to have a portion through which no current flows and a portion to which a reverse bias is applied, the portions being separately driven.

Although the light source includes two SLDs, the light source may include three or more SLDs. In this case, the lengths of the light emitting region and the light emission spectrum conversion region may be different from each other in each SLD, and the number of SLDs, in which the output light that exits from the end surface of the light emission spectrum conversion region is used, may be two or one.

Example Using Monolithic Light Combiner

Figure 4A:
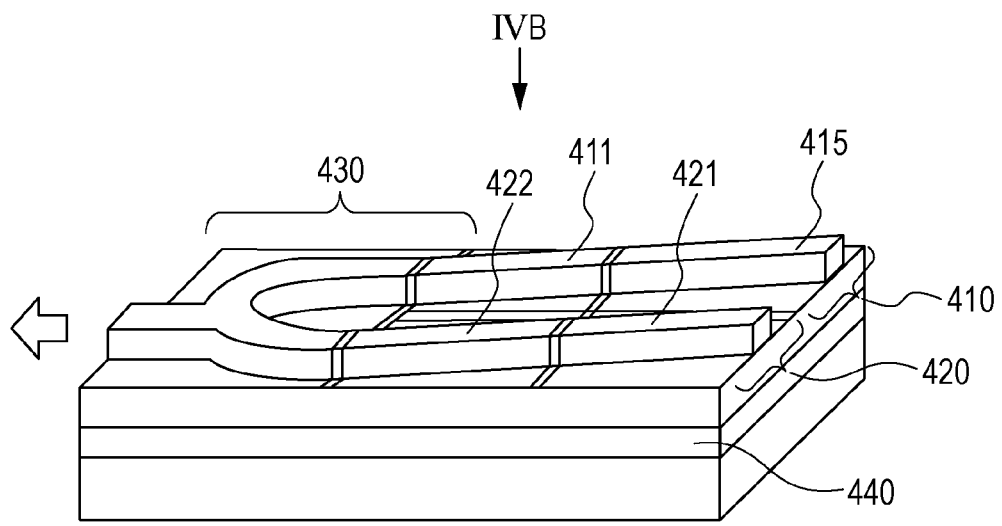
FIGS. 4A and 4B are respectively a perspective view and a plan view illustrating another example of a light source according to the first embodiment of the present invention.
Figure 4B:
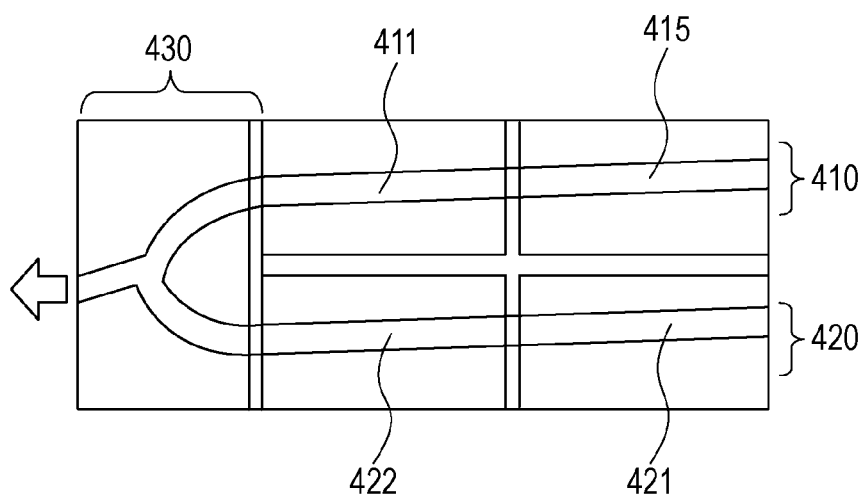

Another example of the light source according to the embodiment of the present invention is described below with reference to FIGS. 4A and 4B. FIG. 4A is a perspective view schematically illustrating the light source according to the present embodiment, and FIG. 4B is a plan view of the light source seen from a direction indicated by an arrow IVB in FIG. 4A.

In the present example, two SLDs, that is, a first SLD 410 and a second SLD 420, and a light combiner 430 are formed as a monolith and have a common active layer 440. The light combiner 430 combines together output light that exits from an exit end surface of a first light emitting region 411 of the first SLD 410 and output light that exits from an exit end surface of a light emission spectrum conversion region 422 of the second SLD 420.

In the present embodiment, an n-type clad layer, an active layer, a p-type clad layer, and a contact layer are stacked one on top of another on an n-type substrate.

The light combiner 430 and ridge portions of the first SLD 410 and the second SLD 420 are formed by general semiconductor lithography and semiconductor etching.

The first light emitting region 411 and a light emission spectrum conversion region 415 of the first SLD 410, a second light emitting region 421 and the light emission spectrum conversion region 422 of the second SLD 420, and the light combiner 430 have respective upper electrodes so as to be independently driven by current. These electrodes are electrically separated from one another by partly removing The GaAs contact layer and Ti/Au of the upper electrodes by, for example, photolithography and wet etching.

In the present embodiment, not only the first SLD 410 and the second SLD 420 but also the light combiner 430 have the respective electrodes so as to allow the current to be injected thereinto. By injecting a certain amount of current into the light combiner 430, absorption of light guided through the light combiner 430 can be suppressed.

In the following description of embodiments, the differences between the first embodiment and each embodiment are explained, and description of common structures or features is omitted. For example, layered structure of the light source according to any of the following embodiments is the same as that illustrated in FIGS. 3A and 3B in the first embodiment. Thus, description and illustration in the drawings of the layered structure of the light source are omitted.

Second Embodiment

Single SLD

Figure 5A:
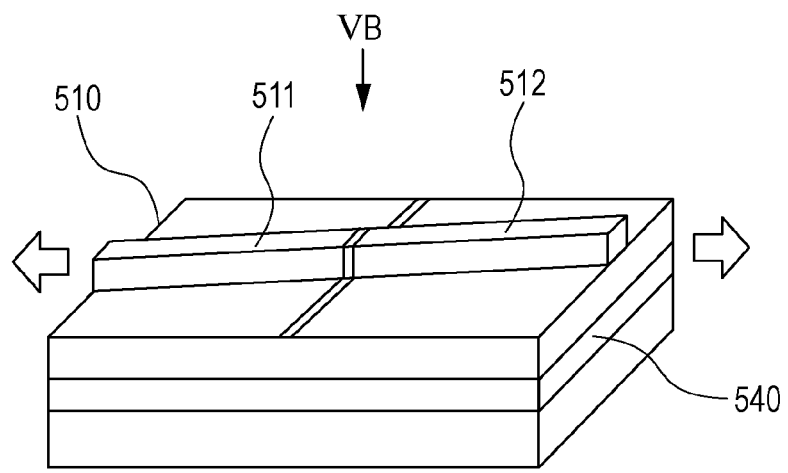
FIGS. 5A and 5B are respectively a perspective view and a plan view illustrating a light source according to a second embodiment of the present invention.
Figure 5B:
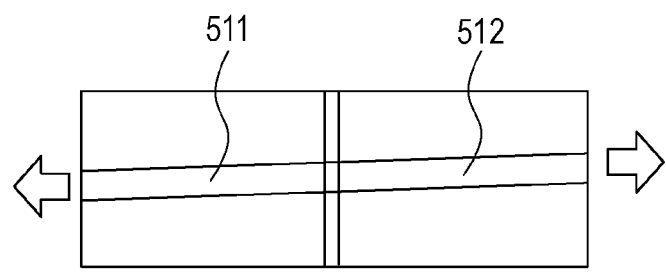

A second embodiment of the present invention is described below with reference to FIGS. 5A and 5B. FIG. 5A is a perspective view schematically illustrating a light source according to the present embodiment, and FIG. 5B is a plan view of the light source seen from a direction indicated by an arrow VB in FIG. 5A.

The light source according to the present embodiment includes a single SLD 510. The SLD 510 includes a light emitting region 511 and a light emission spectrum conversion region 512. A current is injected into the light emitting region 511. Output light is extracted from an exit end surface of the light emitting region 511 and an exit end surface of the light emission spectrum conversion region 512. The output light extracted from both the region is combined together.

The structure of the present embodiment is possible when, in two SLDs of the first embodiment, the length of the first light emitting region 211 of the first SLD 210 is the same as that of the second light emitting region 221 of the second SLD 220, the length of the absorption region 215 is the same as that of the light emission spectrum conversion region 222, and the current injected into the first light emitting region 211 is the same as that injected into the second light emitting region 221. This can further simplifies the structure by, for example, allowing the number of power sources to be reduced.

In order to obtain large output, a plurality of SLDs having this structure may be arranged in parallel with one another. In this case, when each SLD uses the same power source, the plurality of SLDs can be driven by a single power source.

Third Embodiment

A third embodiment of the present invention is described below with reference to FIGS. 6A to 6C. FIG. 6A is a perspective view schematically illustrating a light source according to the present embodiment, FIG. 6B is a view of the light source seen from a direction indicated by an arrow VIB in FIG. 6A, and FIG. 6C is a view of the light source seen from a direction indicated by an arrow VIC in FIG. 6B. Referring to FIGS. 6A and 6C, reference numerals denotes components of the light source as follows: 600 denotes a semiconductor multilayer film (including substrate), 602 denotes an active layer, 604 denotes an insulating film, 606 denotes upper electrodes, 608 denotes a lower electrode, 610 denotes a first light emitting region, 612 denotes a second light emitting region, 614 denotes a light emission spectrum conversion region, and 616 denotes a first end surface.

With the above-described structure, when light generated in one of the light emitting regions is guided through the light emission spectrum conversion region, a short wavelength component of the spectrum of the light generated in the one light emitting region is absorbed and the light having a spectrum mainly having a long wavelength component is emitted. In comparison with the light intensity of the long wavelength component of the light that is generated in the light emitting region and directly exits from the light emitting region without being guided through the light emission spectrum conversion region, the light guided through the light emission spectrum conversion region and exits has the long wavelength component of a higher intensity. By guiding the light, the short wavelength component of which is absorbed and the intensity of the long wavelength component of which is increased, through the other light emitting region, which is different from the light emitting region where this light is originally generated, and by injecting the current into the other light emitting region, the light is amplified. Thus, the light having a spectrum that mainly has the long wavelength component of a more increased intensity is emitted. Also in the other light emitting region where the light is amplified, the light having a spectrum mainly having a short wavelength component is generated. When the light having the spectrum that mainly has the short wavelength component and the light having the spectrum that mainly has the long wavelength component simultaneously exits from the same end surface, the light having a spectrum of a wider full width at half maximum can be obtained compared to the light that is generated in and exits from the light emitting region.

Furthermore, as is the case with the present embodiment, by forming the light emitting regions so that the light emission spectrum conversion region is interposed therebetween, the above-described light having a spectrum of a wide full width at half maximum can be simultaneously obtained from two end surfaces. By combining the light that exits from these two end surfaces together, the light of higher power and having a spectrum of an even wider full width at half maximum can be obtained.

In the case where the waveguide of the light emission spectrum conversion region is short, the light generated in the light emitting regions is insufficiently absorbed even when the light is guided through the light emission spectrum conversion region (in comparison with the case where the length of the light emission spectrum conversion region has an appropriate length, the short wavelength side is insufficiently absorbed and the long wavelength component does not become the main component of the spectrum). This reduces the effect of increasing the spectral range. In the case where the waveguide of the light emission spectrum conversion region is excessively long, the light generated in the light emitting regions is absorbed to a larger extent while being guided through the light emission spectrum conversion region. Thus, the effect of the present invention cannot be achieved, and the spectral range is not increased.

The length of the light emission spectrum conversion region can be such that a peak wavelength λ1 is longer than a peak wavelength λ2 (λ1<λ2). Here, the peak wavelength λ1 is a peak wavelength of the spectrum of the light that is generated in the second (first) light emitting region, guided through the light emission spectrum conversion region and then the first (second) light emitting region, and exits from the first (second) end surface; and the peak wavelength λ2 is a peak wavelength of the spectrum of the light that is generated in the first (second) light emitting region and exits from the first (second) end surface.

As described above, with the structure according to the present embodiment, an SLD that emits light having a high-power wide spectral range can be easily realized at a low cost.

Although the upper electrode 606 is not formed in the light emission spectrum conversion region 614 in the present embodiment, the light emission spectrum conversion region 614 is not limited to this. The upper electrode 606 may be formed in the light emission spectrum conversion region 614. In the case where the upper electrode 606 is formed in the light emission spectrum conversion region 614, whether or not the current is injected thereinto, whether or not a reverse bias is injected thereinto, or the like can be appropriately selected in accordance with the structure (such as the length of each region). Although a single upper electrode 606 is formed in each light emitting region in the present embodiment, the upper electrode 606 is not limited to this. A plurality of the upper electrodes may be formed in each light emitting region. Also, in the case where the upper electrode is formed in the light emission spectrum conversion region, a single or a plurality of the upper electrodes can be formed. Although the active layer 602 uses an asymmetric multi-quantum well structure having different well widths in the present embodiment, the active layer is not limited to this. An asymmetric multi-quantum well structure having different compositions, or an asymmetric multi-quantum well structure, both the well widths and compositions of which are varied, may be used. The number of quantum wells is not limited to four. A single quantum well structure or a usual multi-quantum well structure may be used. The material of the quantum well is not limited to InGaAs.

In a second example described later, the length of the first light emitting region 610 is set to 0.2 mm, the length of the second light emitting region 612 is set to 0.25 mm, and the length of the light emission spectrum conversion region 614 is set to 0.25 mm. However, the lengths of these regions are not limited to the above-described lengths and may be appropriately changed. Although the ridge width is set to 3 µm and the ridge height is set to 0.8 µm, these do not limit the ridge width and ridge height. The lengths and the current injection amounts of each light emitting region and the light emission spectrum conversion region may be appropriately changed. A desired spectral shape can be obtained by combining appropriate lengths and the current injection amounts.

Techniques (apparatuses) are not limited to techniques (apparatuses) used or described in the metal organic chemical vapor deposition (MOCVD) crystal growth method, lithography, etching, asking, and vapor deposition as will be described later in the second example. Any techniques (apparatuses) may be used as long as the similar effects can be obtained.

Fourth Embodiment

A fourth embodiment of the present invention is described below with reference to FIGS. 7A and 7B. FIG. 7A is a perspective view schematically illustrating a light source according to the present embodiment, and FIG. 7B is a view of the light source seen from a direction indicated by an arrow VIIB in FIG. 7A. In an example SLD of the present embodiment, light exits from two end surfaces of the element as signals. By optimally setting the lengths and the current injection amounts of a first light emitting region 710, a second light emitting region 712, and a light emission spectrum conversion region 714 (for example, setting the lengths of the first light emitting region 710 and the second light emitting region 712 to be equal to each other and the length of the light emission spectrum conversion region 714 to be longer than that of each of two light emitting regions), output light having a wide spectral range can be obtained from each of the first end surface 716 and the second end surface 718. When the output light from both the end surfaces is combined together by using an optical fiber (not shown), an SLD that emits high-power light having a wide spectral range can be obtained. Although an upper electrode 706 is not formed in the light emission spectrum conversion region 714 illustrated in FIG. 7A or 7B, which illustrate the structure of the present embodiment, the light emission spectrum conversion region 714 is not limited to this. The upper electrode 706 may be formed in the light emission spectrum conversion region 714. In the case where the upper electrode 706 is formed in the light emission spectrum conversion region 714, whether or not the current is injected thereinto, whether or not a reverse bias is injected thereinto, or the like can be appropriately selected in accordance with the structure (such as the length of each region). Also in the present embodiment, the optical fiber is used as the light combiner. However, the light combiner is not limited to this. Another light combining method may be used as long as the output light that exits from both the end surfaces can be combined together.

Fifth Embodiment

In the present embodiment, an SLD includes a light emitting region, into which the current is injected, a light emission spectrum conversion region, and a reflector in one of end surfaces. With this structure, light generated by the light emitting region is guided through the light emission spectrum conversion region and light emitting region so as to be utilized. This permits wide range spectral characteristics to be obtained.

Figure 8A:
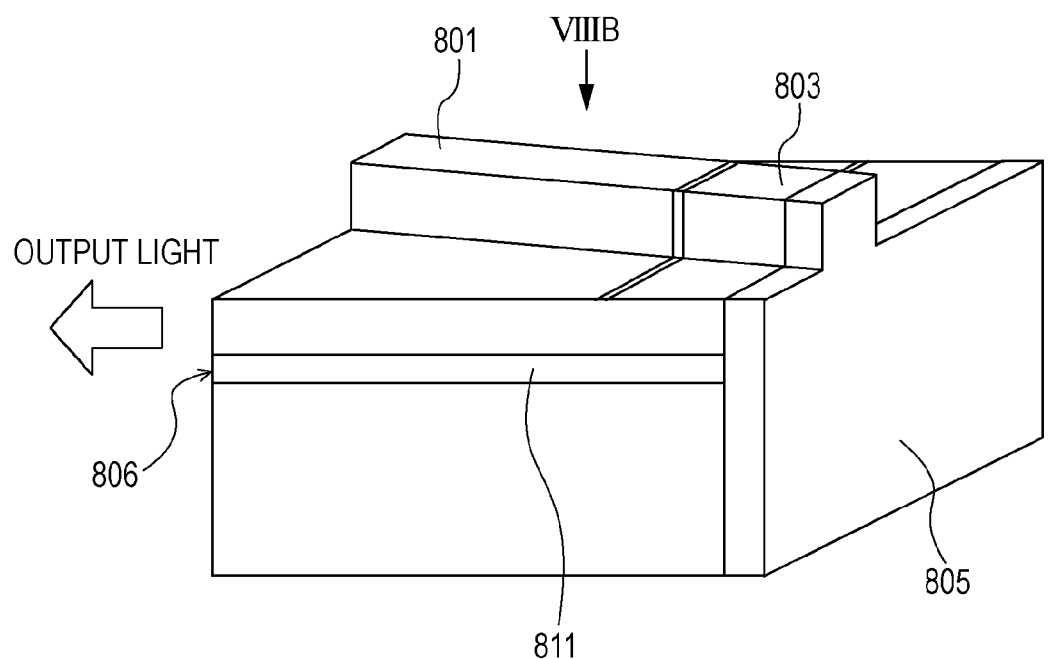
FIGS. 8A and 8B are respectively a perspective view and a plan view illustrating a light source according to a fifth embodiment of the present invention.
Figure 8B:
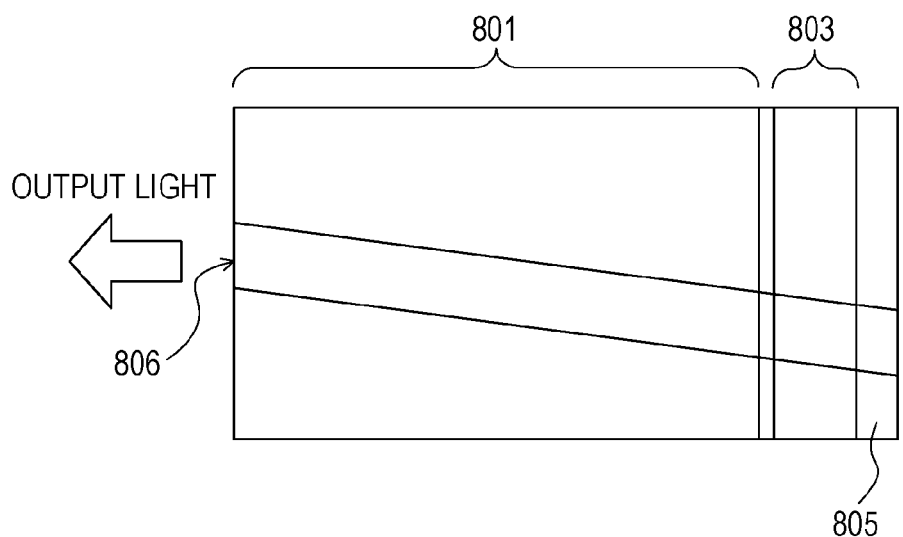

A light source according to the present embodiment is described below with reference to FIGS. 8A and 8B. FIG. 8A is a perspective view schematically illustrating a light source according to the present embodiment, and FIG. 8B is a plan view of the light source seen from a direction indicated by an arrow VIIIB in FIG. 8A.

The light source according to the present embodiment has a ridge waveguide structure and includes a light emitting region 801 disposed adjacent to a light exit end surface, a light emission spectrum conversion region 803 disposed adjacent to the light emitting region 801, and a reflection film 805 disposed on an end surface opposite to the light exit side. With this structure, light that directly exits the light emitting region 801 can exits from the same exit end surface 806 together with the light guided from the light emitting region 801 through the light emission spectrum conversion region 803. Thus, light having a spectrum of a wide full width at half maximum can be easily obtained with a simple structure.

The above-described formation methods, the semiconductor materials, the electrode materials, the dielectric materials, and the like are not limited to those disclosed in the present embodiment. Other methods and materials can be used without departing from the gist of the present embodiment. For example, the substrate may use a p-type GaAs substrate. In this case, the conductivity types of the semiconductor layers are changed in accordance with the changed substrate material.

Although the active layer uses a single quantum well structure, the active layer may use an asymmetric multi-quantum well structure or an asymmetric multi-quantum well having different well widths and different compositions.

The material is not limited to the above description. GaAs, GaInP, AlGaInN, AlGaInAsP, AlGaAsSb, or another light emitting material may be used.

Although the ridge width is set to 4 μm, the ridge width is not limited to this and may be appropriately changed.

Although the SLD uses a ridge portion and the ridge is inclined, it is sufficient that the structure be operated as an SLD. For example, the ridge is not necessarily inclined, and the ridge, which is not inclined, may be used as a highly reflective film.

Although the light exit end is set adjacent to the active region, an absorption region (window region), to which no voltage is applied, may be provided between the active region and the light exit end so as to suppress reflection of light at the light exit end.

The absorption characteristics of the light emission spectrum conversion region may be changed by applying a reverse bias voltage thereto. In the case where voltage is not applied to the light emission spectrum conversion region as is the case with the present embodiment, an insulating film on the upper side of the ridge may be left so as to inhibit the current injection.

Although the active region includes a single electrode, the active region may include a plurality of electrodes, and the current is injected into each of the electrodes for driving. The light emission spectrum conversion region may include a plurality of electrodes so as to have a portion through which no current flows and a portion to which a reverse bias is applied, the portions being separately driven.

Here, in the case where the light emission spectrum conversion region is excessively short, the spectral shape of the light after the light has been guided through the light emission spectrum conversion region is almost unchanged. Thus, the effect of the light source according to the present embodiment cannot be sufficiently obtained. In the case where the light emission spectrum conversion region is excessively long, the intensity of light after the light has been guided through the light emission spectrum conversion region is excessively weak. Thus, the effect of the present embodiment cannot be sufficiently obtained. Here, a preferable range of a length L of the light emission spectrum conversion region is described below.

It is defined that a peak wavelength of the spectrum of light that is generated in the light emitting region and directly exits the light emitting region is $\lambda_1$; a peak wavelength of the spectrum of the light having been guided through the light emission spectrum conversion region is $\lambda_2$; the absorption coefficients at $\lambda_1$ and $\lambda_2$ are respectively $\alpha_1$ and $\alpha_2$; the intensities of the light immediately before the light is guided through the light emission spectrum conversion region at the wavelength $\lambda_1$ and $\lambda_2$ are respectively $P_1$ and $P_2$; the intensities of the light having been guided through the light emission spectrum conversion region and further having been guided through and amplified in the active layer region at the wavelength $\lambda_1$ and $\lambda_2$ are respectively $P_1'$ and $P_2'$; and here, the amplification factors of the light at $\lambda_1$ and $\lambda_2$ are respectively $A_1$ and $A_2$.

The lower limit value of L is initially described. In the present invention, the peak wavelength of light is shifted to the long wavelength side when the light is guided through the light emission spectrum conversion region. Since this effect is made apparent when $\lambda_1 \leq \lambda_2$, the lower limit value of L is obtained when $\lambda_1 = \lambda_2$, and the lower limit value of L is calculated as follows:

$$\lambda = \lambda_2 \Rightarrow P'_1 = P'_2$$

$$A_1 P_1 \exp(-2\alpha_1 L) = A_2 P_2 \exp(-2\alpha_2 L)$$

$$\rightarrow L_{min} = \frac{\ln \frac{A_1 P_1}{A_2 P_2}}{2(\alpha_1 - \alpha_2)}.$$

Next, the upper limit value of L is described. In order to sufficiently obtain the effect of the present invention, the light having been guided through the light emission spectrum conversion region and further guided through the light emitting region needs to have a certain magnitude. Here, this magnitude is defined as $P_{min}$. When $P_2$ is equal to or more than $P_1/2$, the effect to increase the spectral range can be obtained even when the $P_2'$ is about $P_1/4$. When $P_2$ is less than $P_1/2$, $P_2'$ needs to be equal to or more than $P_1/2$ in order to increase the full width at half maximum. Thus, the upper limit value of L is calculated as follows:

$$\text{when } P_2 \geq \frac{P_1}{2},$$

$$P'_2 = \frac{P_1}{4}$$

$$A_2 P_2 \exp(-2\alpha_2 L) = \frac{P_1}{4}$$

$$\rightarrow L_{max} = \frac{\ln \frac{4A_2 P_2}{P_1}}{2\alpha_2}, \text{ and}$$

$$\text{when } P_2 < \frac{P_1}{2},$$

$$P'_2 = \frac{P_1}{2}$$

$$A_2 P_2 \exp(-2\alpha_2 L) = \frac{P_1}{2}$$

$$\rightarrow L_{max} = \frac{\ln \frac{2A_2 P_2}{P_1}}{2\alpha_2}.$$

Sixth Embodiment

In the present embodiment, an optical coherence tomography (OCT) apparatus using the light source according to one of the above-described first to fifth embodiment is described with reference to FIG. 9. The OCT apparatus according to the present embodiment includes the above-described light source, an interference optical system, a wavelength dispersion unit, a light detection unit, and an information acquisition unit. The interference optical system causes light from the light source to be divided into irradiation light, with which an object is irradiated, and reference light so as to generate interference light from the irradiation light emitted to and reflected by the object and the reference light. The wavelength dispersion unit causes the interference light to undergo wavelength dispersion. The light detection unit receives the interference light having undergone wavelength dispersion. The information acquisition unit acquires information about the object in accordance with the intensity of the interference light.

Specifically, the OCT apparatus according to the present embodiment at least includes a light source 901, an interference optical system 902, a wavelength dispersion unit 963, a light detection unit 964, and an information acquisition unit 970. The light source 901 is the light source according to one of the above-described first to fifth embodiments.

Light emitted from the light source 901 is output through the interference optical system 902 as interference light having information about an object 950, which is a measurement object. The interference light with which the wavelength dispersion unit 963 is irradiated is received as light having different wavelengths, with which different positions of the light detection unit 964 is irradiated. The information acquisition unit 970 acquires information about the object 950 (for example, tomographic image information) from information about the intensity of the light received by the light detection unit 964.

Next, the details of the OCT apparatus according to the present embodiment are described with an example.

Figure 9:
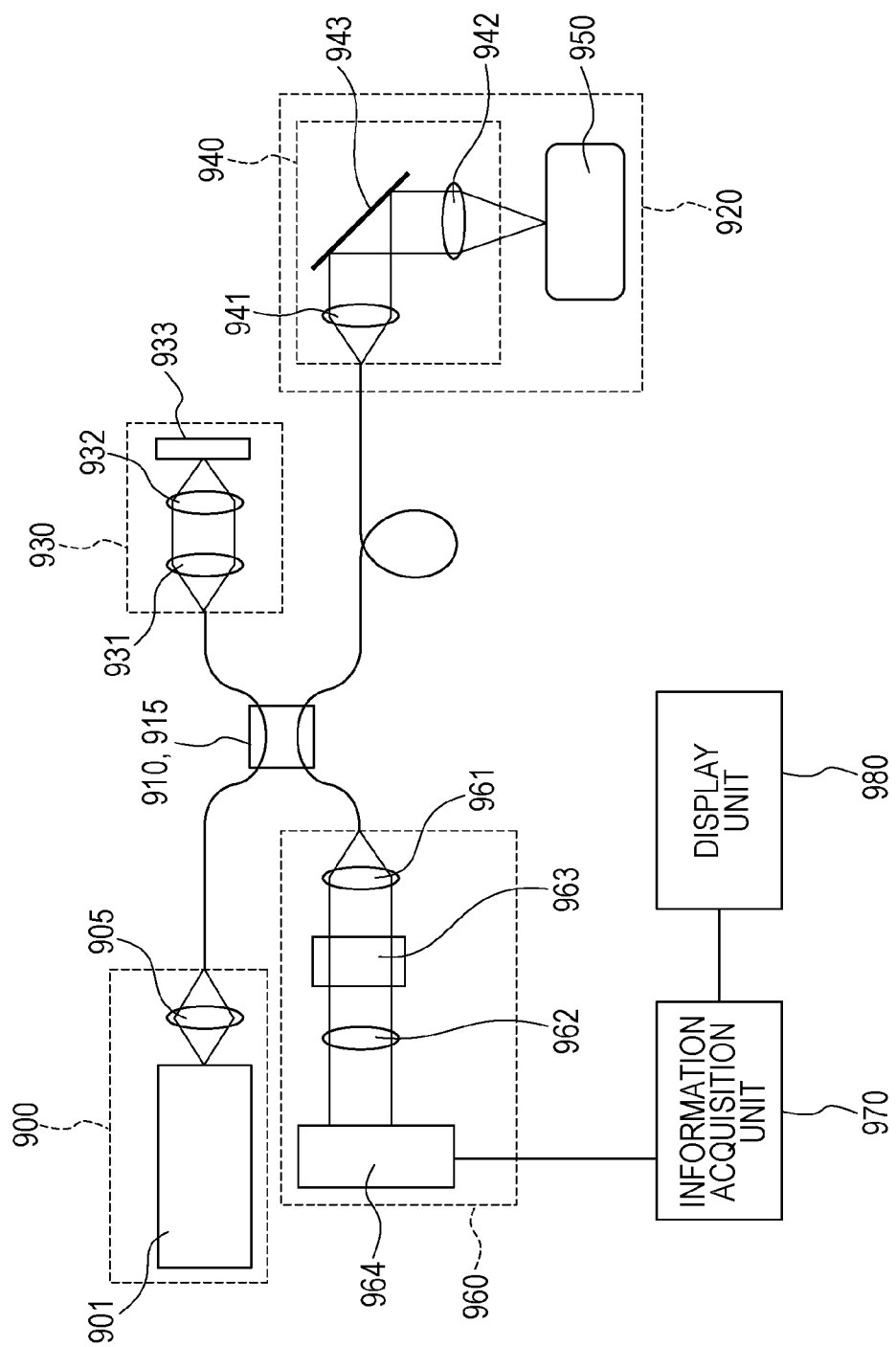
FIG. 9 is a diagram illustrating an optical coherence tomography (OCT) apparatus according to a sixth embodiment of the present invention.

The OCT apparatus illustrated in FIG. 9 includes a light output unit 900, a light separating unit 910, a reference light reflection unit 930, a measurement unit 920, an interference unit 915, a light detection optical system 960, the information acquisition unit 970, and a display unit 980. The light separating unit 910 separates light that exits the light output unit 900 into the reference light and the measurement light. The measurement unit 920 includes an irradiation optical system 940 that irradiates the measurement object 950 with light. The interference unit 915 causes the reflected reference light and the reflected measurement light to interfere with each other. The light detection optical system 960 detects the interference light obtained by the interference unit 915. The information acquisition unit 970 acquires information about a tomographic image in accordance with the light detected by the light detection optical system 960. The display unit 980 displays a tomographic image.

The light output unit 900 separates the light into the reference light and the measurement light through an optical fiber using the light separating unit 910. Part of the separated light enters the reference light reflection unit 930. Here, the light separating unit 910 and the interference unit 915 use the same fiber coupler.

The reference light reflection unit 930 includes collimator lenses 931 and 932 and a reflecting mirror 933. The light is reflected by the reflecting mirror 933 and incident upon the optical fiber again. The measurement light, which is another part of the light from the optical fiber separated by the light separating unit 910 enters the measurement unit 920. The irradiation optical system 940 of the measurement unit 920 includes collimator lenses 941 and 942 and a reflecting mirror 943 that bends the optical path by 90 degrees. The irradiation optical system 940 causes the light having been incident thereupon to be incident upon the measurement object 950 and causes the reflected light to be coupled to the optical fiber again.

The light returned from the reference light reflection unit 930 and the light returned from the measurement unit 920 pass through the interference unit 915 and enters the light detection optical system 960. The light detection optical system 960 includes collimator lenses 961 and 962, the spectroscope 963, and the line sensor 964. The line sensor 964 acquires spectral information about the light dispersed by the spectroscope as the wavelength dispersion unit 963. The spectroscope 963 uses a grating. The light detection optical system 960 acquires the spectral information about the light incident thereupon.

EXAMPLES

First Example

A first example is a light source according to the first embodiment (FIGS. 1 to 3B) in which n-$Al_{0.5}GaAs$ as an n-type clad layer 320, an InGaAs asymmetric multi-quantum well using four quantum wells, the widths of which are different from one another, as the active layer 240, p-Al$_{0.5}$GaAs as a p-type clad layer 340, and heavily doped p-GaAs as a contact layer 350 are stacked one on top of another on an n-type GaAs substrate 310.

As illustrated in FIG. 3A, in the ridge portions of the first SLD 210 and the second SLD 220, the contact layer 350 and a portion of the p-type clad layer 340 down to the middle of the p-type clad layer 340 are partly removed.

After the ridge portions have been formed, the insulating film 360 and upper electrodes 370 are provided on upper surfaces of the ridge portions, and a lower electrode 380 is provided on the lower surface of the substrate.

In the first SLD 210, the upper electrodes 370 form the first light emitting region 211 and the absorption region 215. In the second SLD 220, the upper electrodes 370 form the second light emitting region 221 and the light emission spectrum conversion region 222. In order to independently drive each region, the separated electrodes are provided.

The insulating film 360 is formed of SiO$_2$, the upper electrodes 370 are formed of Ti/Au, and the lower electrode 380 is formed of AuGe/Ni/Au.

In the first SLD 210 and the second SLD 220, the lengths of the elements are as follows: the first light emitting region 211 is 0.2 mm, the absorption region 215 is 0.25 mm, the light emission spectrum conversion region 222 is 0.2 mm, and the second light emitting region 221 is 0.25 mm. In each of the first SLD 210 and the second SLD 220, the electrodes of the regions are separated from each other by some μm, and the ridge width is 4 μm.

In order to prevent reflection at each ridge end surface, the longitudinal direction of the ridge is inclined by seven degrees relative to a line perpendicular to the ridge end surface.

Next, a procedure of producing the light source of the first example is described below.

Initially, semiconductor layers, that is, the n-type clad layer 320, the active layer 240, the p-type clad layer 340, and the contact layer 350 are sequentially grown on the GaAs substrate 310 by, for example, an MOCVD method.

A wafer in which these layers are stacked one on top of another is subjected to typical lithography and semiconductor etching so as to form the ridge portions. After SiO$_2$ has been formed by sputtering, a stripe forming mask is formed of a photoresist by semiconductor lithography so as to form the ridges. Next, the semiconductor in portions other than the stripe forming mask is selectively removed by dry etching. At this time, the semiconductor is removed down to the middle of the p-type clad layer 340, thereby forming ridge shapes of a 0.8 μm depth.

Next, a dielectric film, for example, SiO$_2$, is formed on the surface of the semiconductor, and SiO$_2$ on the upper portions of the ridge portions is partly removed by photolithography and wet etching. Then, by vacuum deposition and lithography, the upper electrodes 370 (Ti/Au) are formed so as to form the first light emitting region 211 and the absorption region 215 in an upper portion of on the first SLD 210 and the second light emitting region 221 and the light emission spectrum conversion region 222 in an upper portion of the second SLD 220. The electrodes are separated from each other between the first light emitting region 211 and the absorption region 215 and between the second light emitting region 221 and the light emission spectrum conversion region 222 by a width of about some μm. Furthermore, the electrode separation portions of the contact layer 350 are formed by wet etching.

Before forming the lower electrode 380, the thickness of the GaAs substrate 310 is reduced to about 100 μm by polishing. Then, the lower electrode 380 (AuGe/Ni/Au) is formed by vacuum deposition. In order to obtain good electric characteristics, the resultant structure is annealed in a high-temperature nitrogen atmosphere so as to alloy the electrode and the semiconductor. At last, crystal faces are exposed at the end surfaces by cleaving, and both the end surfaces are coated with a dielectric film so as to adjust the reflectivity. Thus, the light source is completed.

Figure 10:
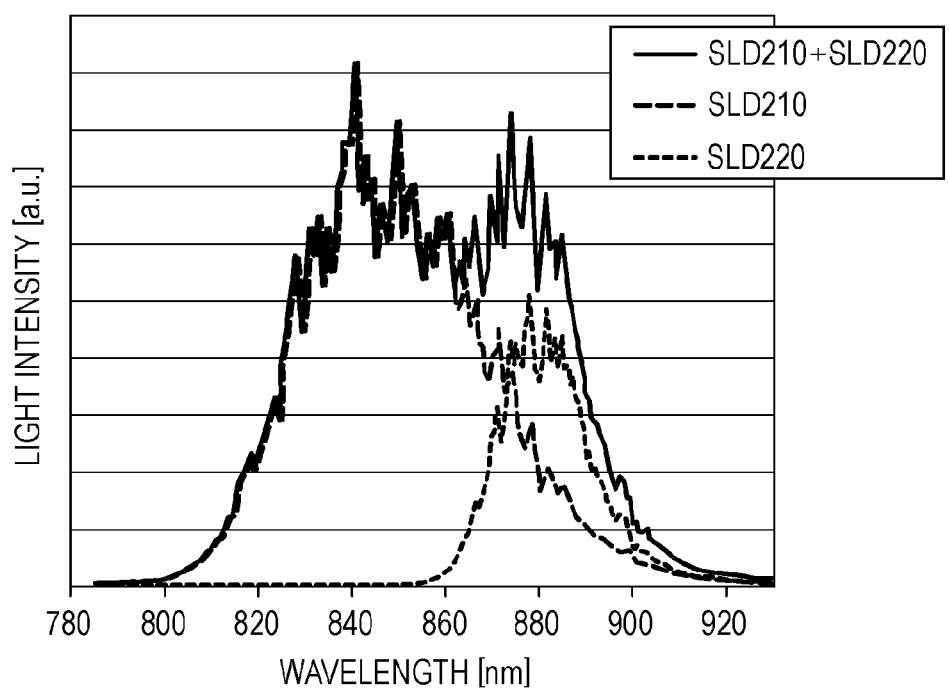
FIG. 10 is a graph illustrating light emission spectra obtained from a light source produced in accordance with a first example of the present invention.

FIG. 10 illustrates the spectral characteristics of the output light of the first SLD 210, the output light of the second SLD 220, and combined output light of the two SLDs. As illustrated in FIG. 10, the light emission spectrum of the light emitted only from the first light emitting region 211 has a peak on the short wavelength side, and the light emission spectrum of the light emitted from the second light emitting region 221 and guided through the light emission spectrum conversion region 222 (SLD 220) has a peak on the long wavelength side. Furthermore, each spectrum has a portion where one of the spectra is superposed with the other spectrum. Thus, by combining the light, the waveform has a wide half width as a result.

In the first SLD 210, a current of 150 mA is injected into the first light emitting region 211 and the output light is extracted from the exit end surface of the first light emitting region 211. In the second SLD 220, a current of 200 mA is injected into the second light emitting region 221, the light is guided through the light emission spectrum conversion region 222, and the output light is extracted from the exit end surface of the light emission spectrum conversion region 222. No current is injected into the absorption region 215 and the light emission spectrum conversion region 222.

It is understood that, in comparison with the first SLD 210, which is a typical SLD in which the light is not guided through the light emission spectrum conversion region 222, the second SLD 220, in which the light that is guided through and exits the light emission spectrum conversion region 222, absorbs the short wavelength side of the light and emits the light having a peak intensity on the long wavelength side. Furthermore, with the second SLD 220, the intensity larger than that obtained with the first SLD 210 can be obtained on the longer wavelength side. It can be confirmed that, in comparison with the spectrum obtained with the first SLD 210, the spectrum of the combined light on the long wavelength side is increased, and accordingly, a wide full width at half maximum of the spectrum can be obtained. In an SLD having a single active layer as described in the present example, it is difficult to obtain the above-described effects without a light emission spectrum conversion region.

As is the case with the present example, when the wavelength corresponding to the peak intensity of the second SLD 220 is on the longer wavelength side compared to the wavelength corresponding to half the peak intensity of the first SLD 210 on the long wavelength side, the half width can be increased further toward the long wavelength side.

The intensity of the light emitted from the second SLD 220 on the long wavelength side is desirably larger than that of the first SLD 210, and the peak intensity of the light emitted from the second SLD 220 is desirably not far smaller than that of the first SLD 210. For example, the peak intensity of the light emitted from the second SLD 220 is desirably equal to or more than, as described here, a one fourth of, and more desirably equal to or more than a half of that emitted from the first SLD 210. When the peak intensity of the light emitted from the second SLD 220 is excessively large, the half width may be reduced contrary to the above-described case. Thus, the peak intensity of the light emitted from the second SLD 220 is desirably, for example, equal to or less than twice that emitted from the first SLD 210.

Second Example

In a second example, the lengths of the regions of the light source of the third embodiment (FIGS. 6A to 6C) are set as follows: the first light emitting region 610 is 0.2 mm, the second light emitting region 612 is 0.25 mm, and the light emission spectrum conversion region 614 is 0.25 mm. With this structure, and by injecting a current of 170 mA into the first light emitting region 610 and a current of 30 mA into the second light emitting region 612, output light having a wide light emission spectral range can be obtained from the first end surface 616. In the present example, no current is injected into the light emission spectrum conversion region 614. Next, a method of producing the SLD of the present example is described.

FIGS. 11A to 12D illustrate the method of producing the SLD of the present example.

Initially, as illustrated in FIG. 11A, the semiconductor multilayer film 600 including the active layer 602 is formed by sequentially stacking layers one on top of another by the MOCVD crystal growth method. The active layer 602 of the present example has a multi-quantum well structure having four quantum wells, which is an InGaAs asymmetric quantum well structure, the well widths of which are different from one another.

Next, as illustrated in FIG. 11B, a first resist pattern 620 is formed on the semiconductor multilayer film 600 by lithography.

Then, as illustrated in FIG. 11C, a ridge structure is formed by dry etching using the first resist pattern 620 as an etching mask. After that, the resist pattern 620 is removed by asking.

In the present example, the width of the ridge structure is set to 3 μm and the height of the ridge structure is set to 0.8 μm. Furthermore, the longitudinal direction (waveguide axis) of the ridge structure is inclined relative to a line perpendicular to the end surface by seven degrees.

Although the resist pattern 620 is used as the etching mask, a dielectric material (for example, $SiO_2$ or the like) may be used as the etching mask.

Next, as illustrated in FIG. 11D, the insulating film 604 is formed by a plasma-enhanced chemical vapor deposition (PECVD) so as to entirely cover the resultant structure. Examples of the material of the insulating film 604 include silicon oxide, silicon nitride, or the like.

Next, as illustrated in FIG. 11E, a second resist pattern 622 is formed by lithography so that only an upper portion of the ridge in a region where the first light emitting region 610 and the second light emitting region 612 are to be formed is exposed.

Figures 12A, 12B, 12C, 12D:
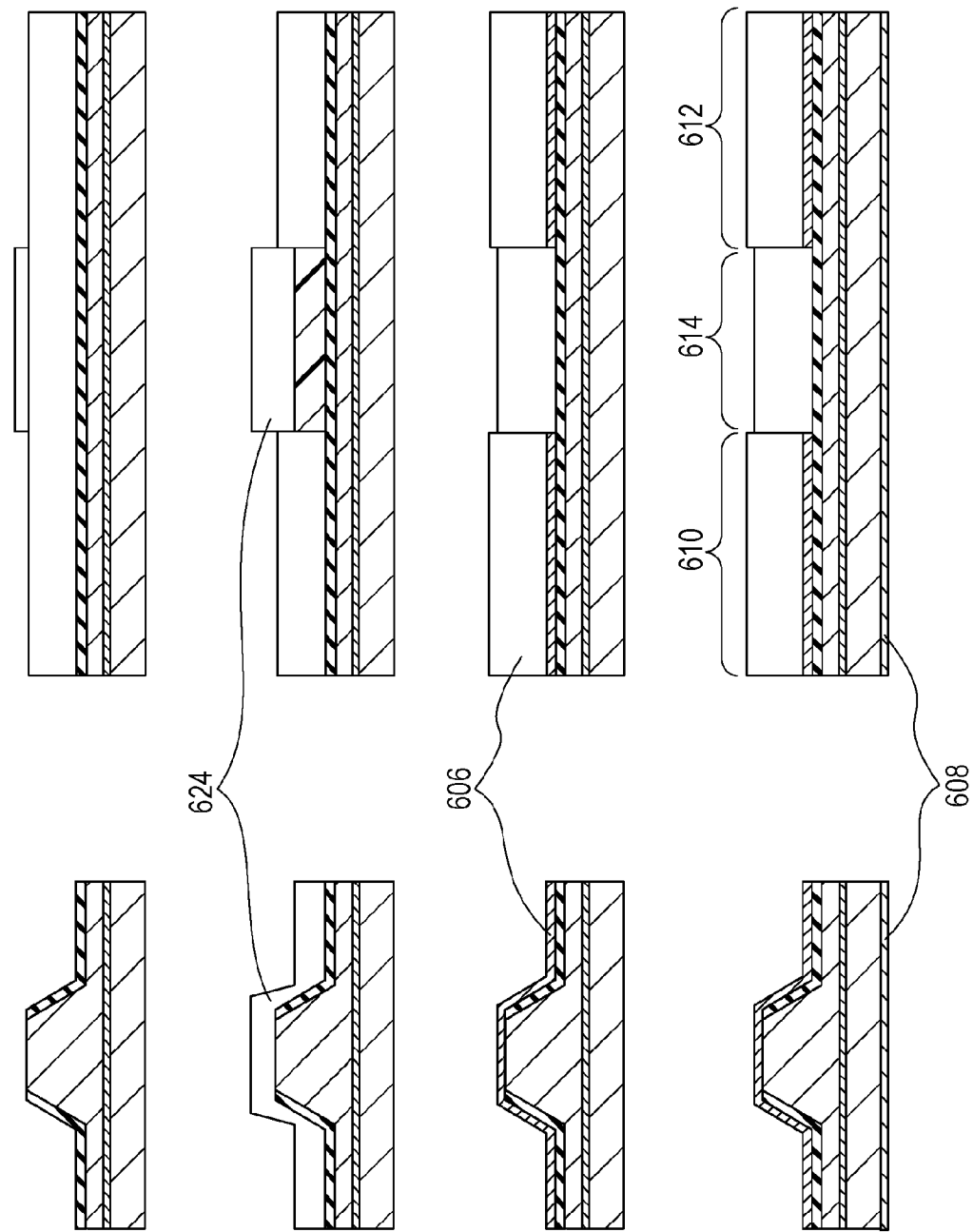
FIGS. 12A to 12D are diagrams illustrating the procedure of producing the light source in the second example of the present invention.

Next, as illustrated in FIG. 12A, by wet etching using buffered hydrogen fluoride (BHF), the insulating film 604 is removed from the upper portion of the ridge in the region where the first light emitting region 610 and the second light emitting region 612 are to be formed. After that, the second resist pattern 622 is removed.

Next, as illustrated in FIG. 12b, a third resist pattern 624 is formed so as to cover a region where the light emission spectrum conversion region 614 is to be formed. This resist pattern determines the lengths of the first light emitting region 610, the second light emitting region 612, and the light emission spectrum conversion region 614.

Then, as illustrated in FIG. 12C, a Ti/Au layer is evaporated onto the surface by metal vapor deposition. After that, the upper electrodes 606 are formed by lift-off so that a region where the light emission spectrum conversion region 614 is to be formed is excluded.

Next, in a step illustrated in FIG. 12D, AuGe/Ni/Au is evaporated onto the rear surface side of the semiconductor multilayer film (including the substrate) 600 by metal vapor deposition, thereby forming the lower electrode 608. Then, crystal faces that will be the first and second end surfaces 616 and 618 are exposed by cleaving, thereby the semiconductor film 600 is divided into elements. After that, both the end surfaces are coated with a dielectric film so as to adjust the reflectivity of the end surfaces. Thus, the light source is completed.

FIG. 13 illustrates light emission spectra of the output light of the SLD described in the present example. The dashed line indicates the light emission spectrum when the light that is generated by injecting a current only into the first light emitting region 610 and exits from the first end surface 616. The solid line indicates the light emission spectrum when the light that is generated by injecting a current into the first light emitting region 610 simultaneously exits from the first end surface 616 with the light generated by injecting a current into the second light emitting region 612, guided through the light emission spectrum conversion region 614, and then guided through the first light emitting region 610.

Third Example

In a third example, a specific example of the light source of the fifth embodiment (FIGS. 8A and 8B) is described.

Figure 14A:
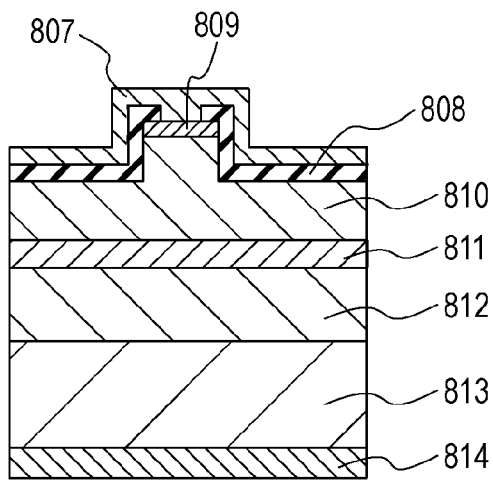
FIGS. 14A and 14B are diagrams illustrating a layered structure of a light source produced in accordance with a third example of the present invention.
Figure 14B:
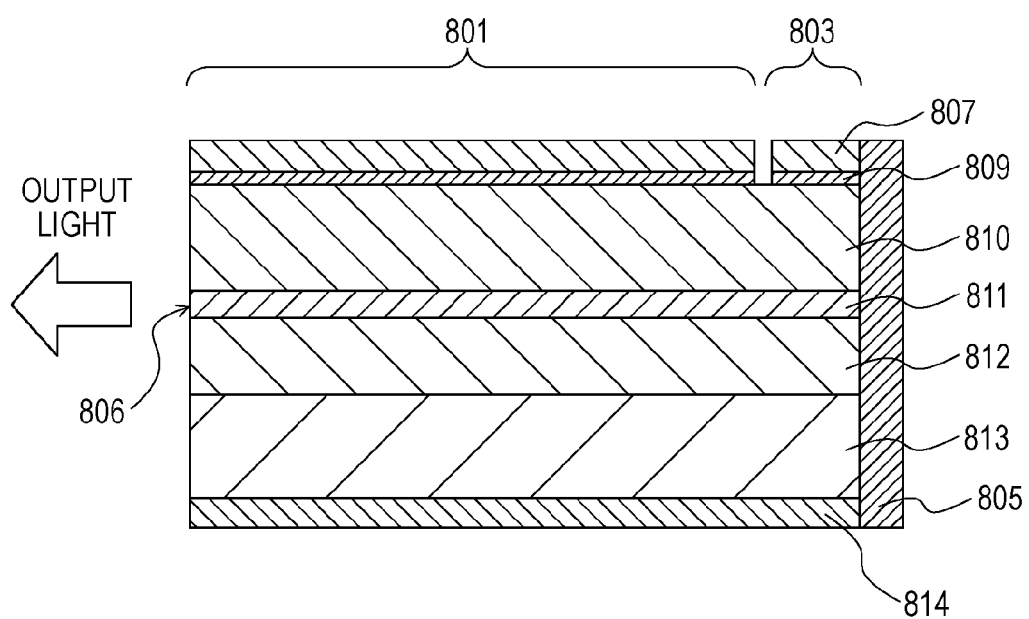
Figure 15A:
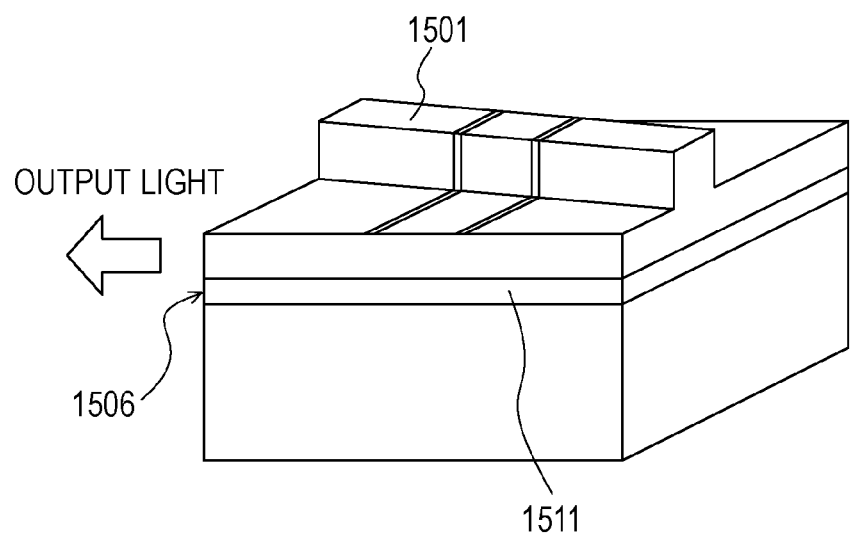
FIGS. 15A and 15B are diagrams illustrating drive conditions of the light source of the third example of the present invention.
Figure 15B:
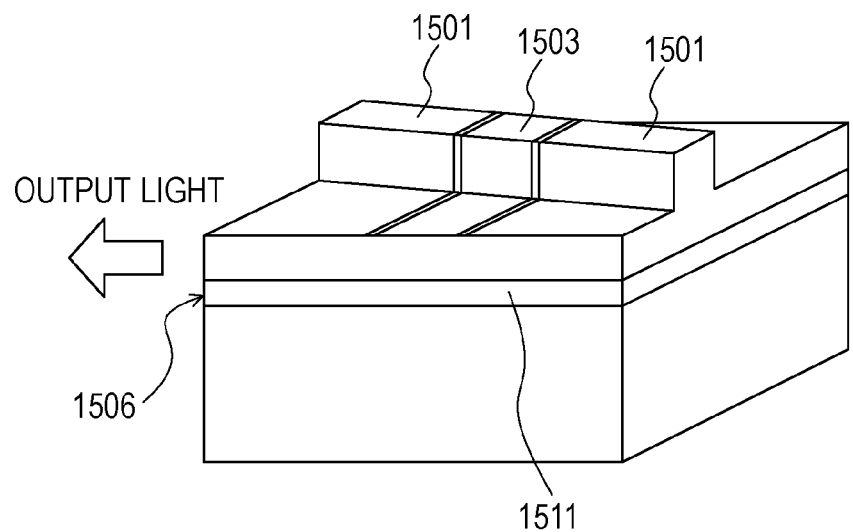

FIGS. 14A and 14B are sectional views illustrating the layered structure of a light source of the present example. In FIGS. 15A and 15B, some layers such as an insulating film 808 are omitted. In the present example, n-$Al_{0.5}GaAs$ as an n-type clad layer 812, an InGaAs single quantum well using one quantum well as an active layer 811, p-$Al_{0.5}GaAs$ as a p-type clad layer 810, and heavily doped p-GaAs as a contact layer 809 are stacked one on top of another on an n-type GaAs substrate 813. In a ridge portion, the contact layer 809 and part of the p-type clad layer 810 are partly removed. After the ridge portion have been formed, the insulating film 808 and upper electrodes 807 are provided on an upper surface of the ridge portion, and a lower electrode 814 is provided on a lower surface of the substrate. For independent drive, the separated upper electrodes 807 are provided. The insulating film 808 is formed of $SiO_2$, the upper electrodes 807 are formed of Ti/Au, and the lower electrode 814 is formed of AuGe/Ni/Au.

Regarding the length of each element, the light emitting region 801 is 0.5 mm and the light emission spectrum conversion region 803 is 0.125 mm. The electrodes of the respective regions are separated from each other by about some μm. The ridge width is 4 μm. In order to prevent reflection at each ridge end surface, the longitudinal direction of the ridge is inclined relative to a line perpendicular to the ridge end surface by seven degrees. Multilayer dielectric films may be added to end surfaces in order to control the reflectance.

Next, an actual procedure of producing the element is described below. Initially, the n-type clad layer 812, the active layer 811, the p-type clad layer 810, and the contact layer 809 are sequentially grown on the GaAs substrate 813 by, for example, an MOCVD method.

A wafer in which these layers are stacked one on top of another is subjected to typical lithography and semiconductor etching so as to form the ridge portion. For example, after the dielectric film has been formed of, for example, SiO$_2$ by sputtering, a stripe forming mask is formed of a photoresist by semiconductor lithography so as to form the ridge. Then, the semiconductor in portions other than the stripe forming mask are selectively removed by dry etching. At this time, the semiconductor is removed down to the middle of the p-type clad layer 810, thereby forming ridge shapes of, for example, a 0.8 μm depth.

Next, a dielectric film, for example, an SiO$_2$ film, is formed on the surface of the semiconductor, and SiO$_2$ on the upper portion of the ridge portion is partly removed by photolithography and wet etching. After that, the upper electrodes 807 are formed by vacuum deposition and lithography. The upper electrodes 807 are formed of, for example, Ti/Au. Furthermore, an electrode separation portion of the contact layer 809 is formed by wet etching.

Before forming the lower electrode 814, the thickness of the GaAs substrate 813 is reduced to about 100 μm by polishing. Then, the lower electrode 814 is formed by vacuum deposition. The lower electrode 814 is formed of, for example, AuGe/Ni/Au. In order to obtain good electric characteristics, the resultant structure is annealed in a high-temperature nitrogen atmosphere so as to alloy the electrode and the semiconductor.

At last, crystal faces are exposed at the end surfaces by cleaving, and the end surface on a side opposite to the light exit side is coated with the highly reflective reflection film 805. A reflectivity of 99% is achieved by providing a dielectric distributed Bragg reflector (DBR) is provided as the highly reflective reflection film 805.

Figure 16A:
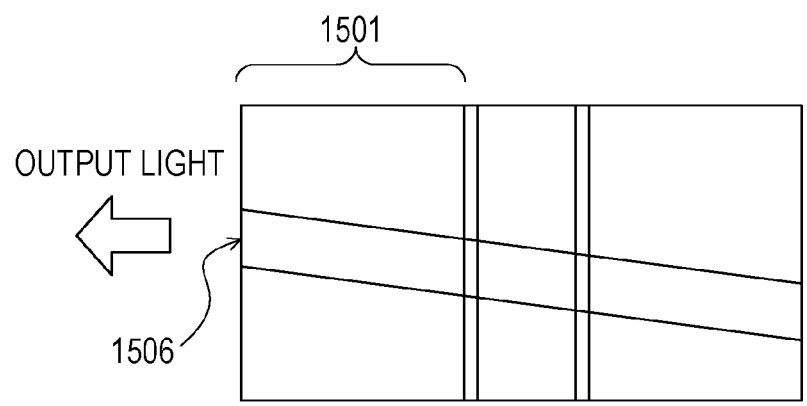
FIGS. 16A and 16B are diagrams illustrating the drive conditions of the light source of the third example of the present invention.
Figure 16B:
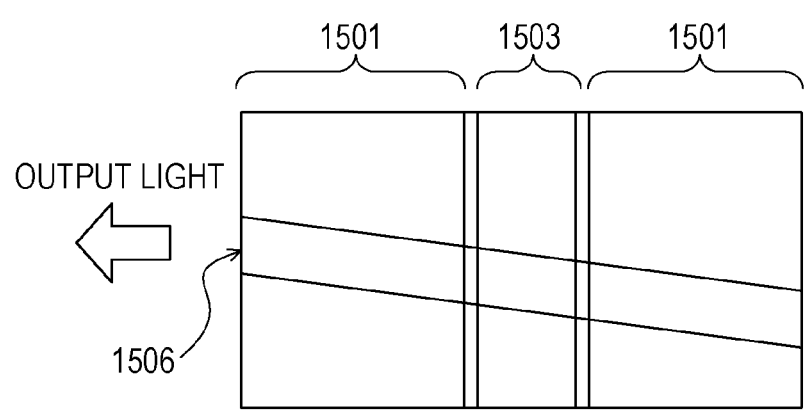

Next, measurement results in the present example are described. The measurement is performed with a configuration, which is equal to the present example, as illustrated in perspective views in FIGS. 15A and 15B and in plan views in FIGS. 16A and 16B. As illustrated in, for example, FIGS. 16A and 16B, a light emission spectrum conversion region 1503 is interposed between regions having an equal length that each allow a current to be injected thereinto. Here, in drive condition (1), a current is injected only into a region in contact with a light exit end 1506; and in drive condition (2), currents are injected both the regions. The drive condition (1) equals to a case where, in the example 3, the light generated in the light emitting region 801 directly exits the light emitting region 801. The drive condition (2) equals to a case where the light generated in the light emitting region 801 is guided through the light emission spectrum conversion region 803 and the light emitting region 801 and exits. The length of two active regions 1501 are both 0.5 mm, and a current of 250 mA is injected into one or both of the active regions 1501. The length of the light emission spectrum conversion region 1503 is 0.25 mm.

Figure 17:
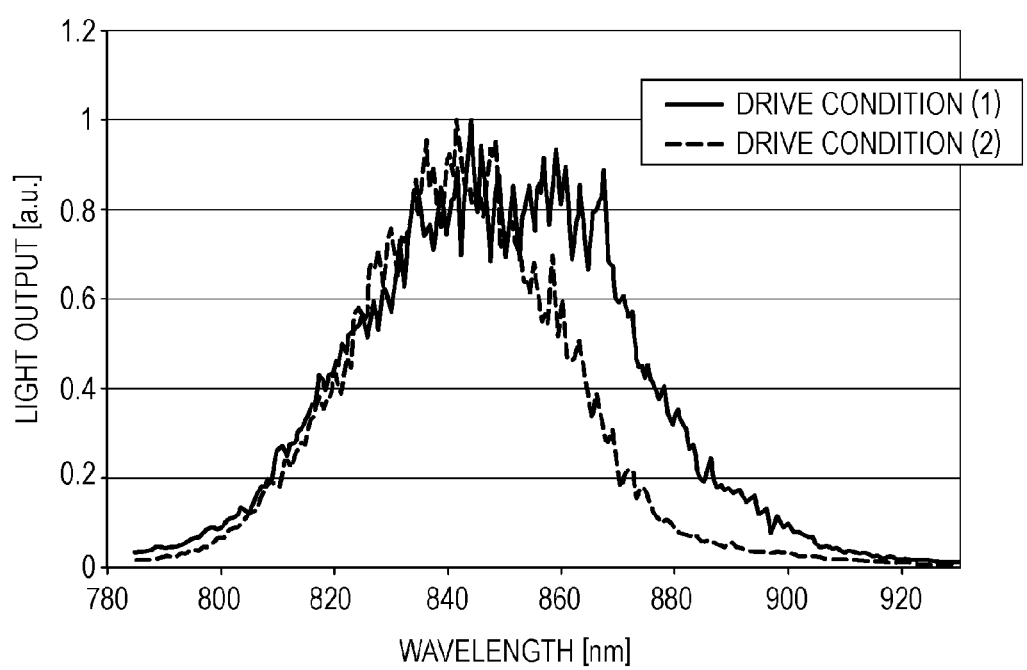
FIG. 17 is a graph illustrating light emission spectra obtained from the light source produced in accordance with the third example of the present invention.

FIG. 17 illustrates the light emission spectra under the drive conditions (1) and (2). From FIG. 17, it can be seen that a full width at half maximum of the spectrum obtained under the drive condition (2) is wider than that obtained under the drive condition (1). The reason of this is because, by guiding the light through the light emission spectrum conversion region 803, another peak appears near 870 nm, which is on the long wavelength side with respect to the peak wavelength of 840 nm under the drive condition (1).

In an SLD having a single active layer as described in the present example, it is difficult to obtain the above-described effects without a light emission spectrum conversion region. When the current density is increased, light emission becomes significant on the short wavelength side. Thus, the present invention, which permits the light emission on the long wavelength side to be increased while the power is maintained at the same level, produces a significant effect.

In order to obtain a wide full width at half maximum of the spectrum, the peak intensity of the light guided through the light emission spectrum conversion region and the active region is desirably equal to or more than a half the peak intensity of the light that directly exits the active layer. However, when the former peak intensity is excessively large, the full width at half maximum is decreased. Thus, the former peak intensity is desirably equal to or less than twice the latter peak intensity.

The length, the current injection amount, and the reflectivity of the reflection film of the active region and the light emission spectrum conversion region of the SLD may be appropriately changed. A desired spectral shape can be obtained by combining these values in accordance with appropriate conditions.

Fourth Example

A fourth example of the present invention is described below with reference to FIGS. 18A and 18B.

The present example includes two SLDs that include active regions 1801 and 1802, light emission spectrum conversion regions 1803 and 1804, and a highly reflective reflection film 1805. The active regions 1801 and 1802 are disposed on the light exit side, the light emission spectrum conversion regions 1803 and 1804 are each disposed adjacent to a corresponding one of the active regions 1801 and 1802, and the reflection film 1805 is disposed on an end surface on a side opposite to a light exit side. With this structure, when compared to the first example, the lengths and the current densities of the active regions 1801 and 1802 and the light emission spectrum conversion regions 1803 and 1804 can be independently set. This facilitates control of the light emission spectrum.

Figure 18A:
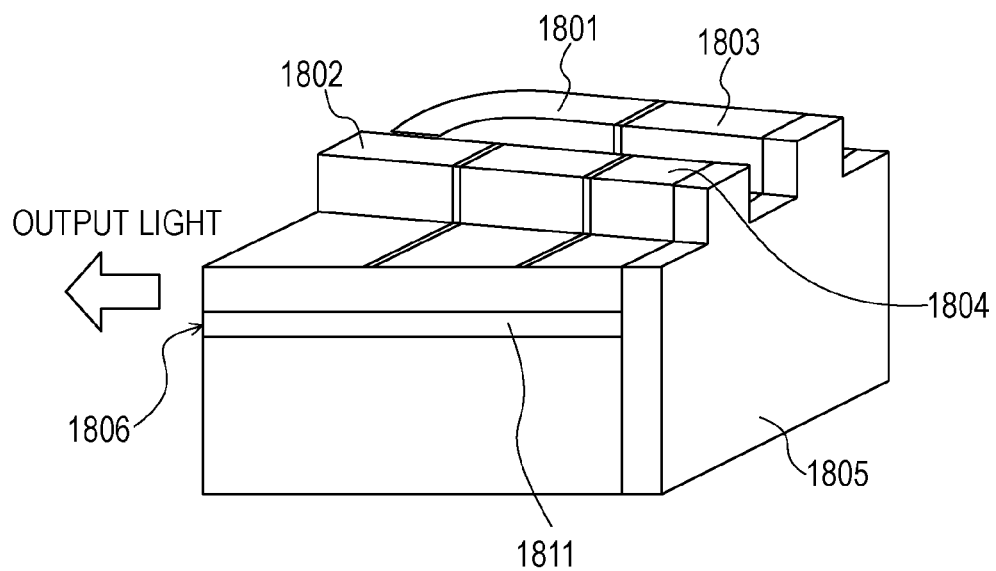
FIGS. 18A and 18B are respectively a perspective view and a plan view illustrating a light source produced in accordance with a fourth example of the present invention.
Figure 18B:
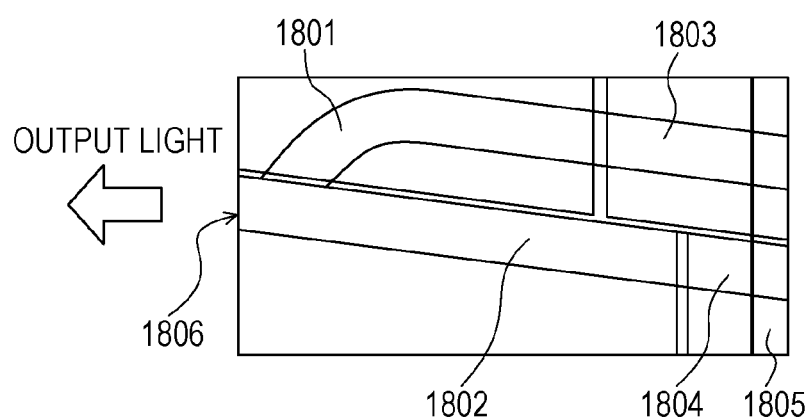

Furthermore, with the structure as illustrated in FIGS. 18A and 18B, the lengths of the SLDs can be independently set. In the present example, an n-type clad layer, an active layer, a p-type clad layer, and a contact layer are stacked one on top of another on an n-type substrate. A ridge portion of each SLD is formed by general semiconductor lithography and semiconductor etching. These electrodes are electrically separated from one another by partly removing The GaAs contact layer and Ti/Au of the upper electrodes by, for example, photolithography and wet etching. Although light from two SLDs are combined in the present example, light from three or more SLDs may be combined.

Fifth Example

Figure 19:
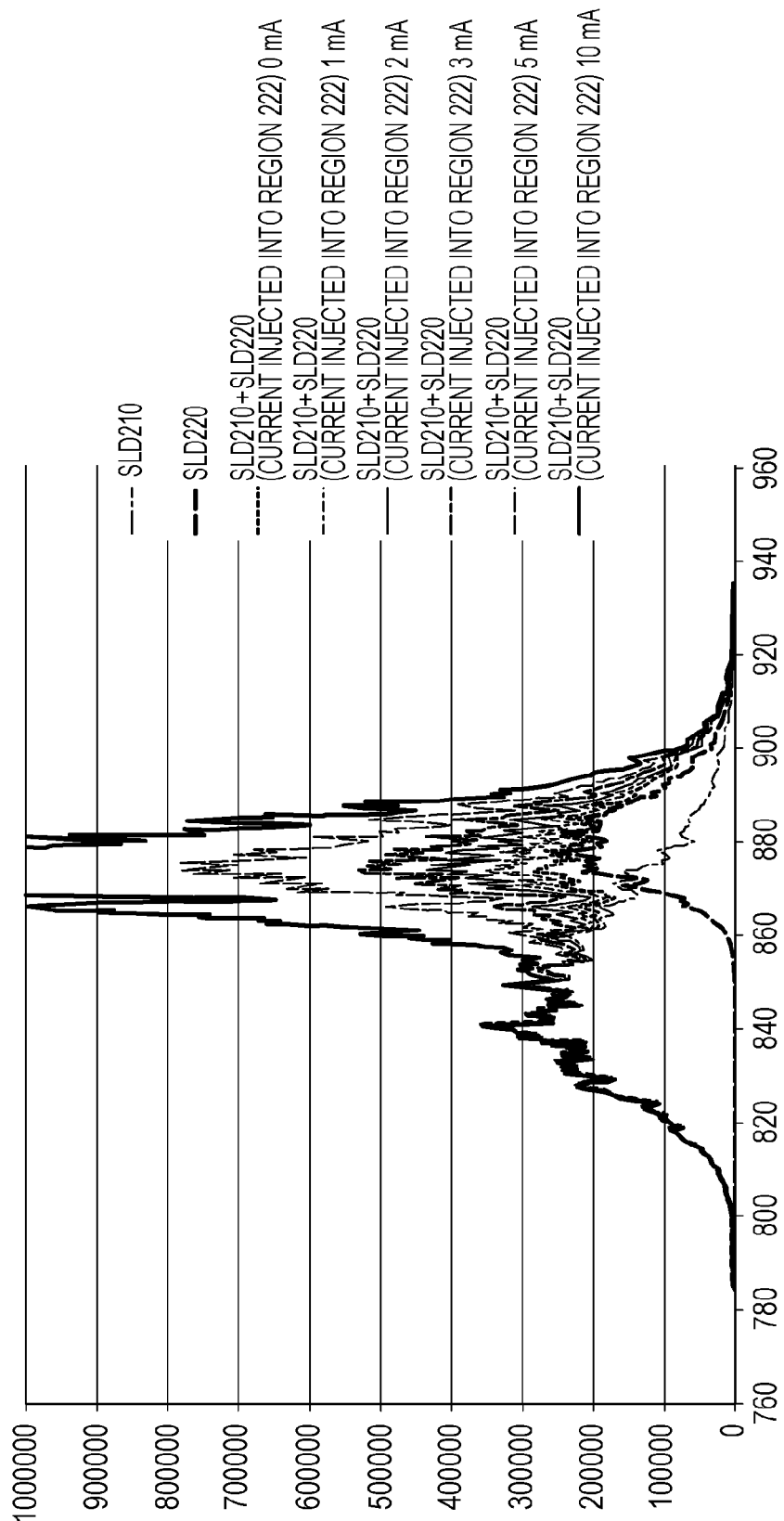
FIG. 19 is a graph illustrating a fifth example of the present invention.

In a fifth example, the current injection amount is varied in the first example (FIG. 19). In the first example, no current is injected into the light emission spectrum conversion region 222. In the present example, the light emission spectrum is measured while the current injected into the light emission spectrum is varied from 1, 2, 3, 5, to 10 mA. As illustrated in FIG. 19, as the current injection amount increases (as the current density of the light emission spectrum conversion region increases), the peak of the long wavelength component increases. Thus, in the case where the light source has a structure as described in the first example, the effect of increasing the full width at half maximum can be obtained when the amount of current up to about 3 mA is injected into the light emission spectrum conversion region 222. The full width at half maximum decreases when the current injection amount is 5 mA or more.

According to the present invention, by utilizing light that is generated in the light emitting region and passes through the light emission spectrum conversion region, a light source that emits light having a light emission spectrum of a wider full width at half maximum can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-217189, filed Sep. 28, 2012, which is hereby incorporated by reference herein in its entirety.

What is claimed is:

1. A light source comprising:
   a superluminescent diode that includes
      a first light emitting region and a second light emitting region different from the first light emitting region, and
      a light emission spectrum conversion region interposed between the first light emitting region and the second light emitting region; and
   a control unit that controls currents injected into the first light emitting region, the second light emitting region and the light emission spectrum conversion region,
   wherein, light that is emitted from the first light emitting region and passes through the light emission spectrum conversion region changes wavelength and intensity and is combined with the light that is emitted from the first light emitting region or the second light emitting region and does not pass through the light emission spectrum conversion region,
   wherein the control unit controls the currents injected into the light emission spectrum conversion region and the first light emitting region so that a current density of the light emission spectrum conversion region is smaller than a current density of the first light emitting region,
   wherein the control unit controls the current injected into the light emission spectrum conversion region independently from the currents injected into the first light emitting region and the second light emitting region so that the current density of the light emission spectrum conversion region is in a range from 0 to 2 $kA/cm^2$ or a reverse bias is applied to the light emission spectrum conversion region so that the current thereof flows in a direction opposite to a direction in which a current injected into the first light emitting region flows, and
   wherein the superluminescent diode has a ridge waveguide structure inclined to a line perpendicular to end surfaces of the superluminescent diode, such that a direction of propagation of light emitted by the superluminescent diode is inclined relative to the line perpendicular to the end surfaces.

2. The light source according to claim 1,
   wherein the control unit controls the currents injected into the light emission spectrum conversion region and the first light emitting region so that the current density of the light emission spectrum conversion region is equal to or less than 10% of the current density of the first light emitting region.

3. The light source according to claim 1,
   wherein the control unit controls the current injected into the light emission spectrum conversion region so that the current density of the light emission spectrum conversion region is 0 $kA/cm^2$.

4. The light source according to claim 1,
   wherein the light emission spectrum conversion region has a waveguide structure.

5. The light source according to claim 1,
   wherein the first light emitting region and the light emission spectrum conversion region have a common active layer.

6. The light source according to claim 5, wherein the active layer has an asymmetric multi-quantum well structure.

7. The light source according to claim 5,
   wherein the active layer includes $In_xGa_{(1-x)}As$, where x is 0 to 0.1.

8. The light source according to claim 5, wherein the current injected into the light emission spectrum conversion region is 3 mA or less.

9. The light source according to claim 1,
   wherein the light emitted from the first light emitting region passes through the light emission spectrum conversion region and further passes through the second light emitting region.

10. The light source according to claim 9,
    wherein the light that is emitted from the first light emitting region passes through the light emission spectrum conversion region, passes through the second light emitting region, exits the second light emitting region, and is combined with the light that exits the first light emitting region and does not pass through the second region nor through the light emission spectrum conversion region.

11. An optical coherence tomography apparatus comprising:
    the light source according to claim 1;
    an interference optical system that causes light from the light source to be divided into irradiation light, with which an object is irradiated, and reference light so as to generate interference light from the irradiation light emitted to and reflected by the object and the reference light;
    a wavelength dispersion unit that causes the interference light to undergo wavelength dispersion;
    a light detection unit that receives the interference light having undergone wavelength dispersion; and
    an information acquisition unit that acquires information about the object in accordance with the intensity of the interference light.

12. The light source according to claim 1, wherein a reflection film is disposed on an end surface opposite to a light exit end surface among end surfaces of the superluminescent diode.

13. A light source comprising:
    a multilayer member including two electrode layers and an active layer disposed between the two electrode layers, the multilayer member having a waveguide structure to guide a light in an in-plane direction of the active layer, at least one of the two electrode layers being included in an electrode group composed of two or more electrodes separated in a waveguide direction;
    an optical element from which a light exits from an end surface of an in-plane direction of the multilayer member through the waveguide structure; and
    a control unit configured to inject a current independently into a plurality of different regions of the active layer, using at least a first electrode and a second electrode different from the first electrode in the electrode group, and a light emission spectrum conversion region interposed between the first electrode and the second electrode, wherein the control unit controls the current injected into the light emission spectrum conversion region independently from the currents injected into the first electrode and the second electrode so that a reverse bias is applied to the light emission spectrum conversion region so that the current thereof flows in a direction opposite to a direction in which a current injected into the first electrode flows, and wherein the waveguide structure is a ridge waveguide structure having the waveguide direction inclined to a line perpendicular to end surfaces of the optical element, such that a direction of propagation of the light that exits from the optical element is inclined relative to the line perpendicular to the end surfaces.

14. The light source according to claim 13, wherein the control unit controls the currents injected into the light emission spectrum conversion region and the first electrode so that the current density of the light emission spectrum conversion region is equal to or less than 10% of the current density of the first electrode.

\* \* \* \* \*